United States Patent
Lee et al.

(10) Patent No.: US 12,507,577 B2
(45) Date of Patent: *Dec. 23, 2025

(54) DISPLAY DEVICE

(71) Applicant: Samsung Display Co., Ltd., Yongin-si (KR)

(72) Inventors: Hyun Ju Lee, Asan-si (KR); Kyeom Ryong Kim, Cheonan-si (KR); Young Gil Park, Asan-si (KR); Na Ri Ahn, Seongnam-si (KR); Soo Im Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 656 days.

This patent is subject to a terminal disclaimer.

(21) Appl. No.: 17/649,119

(22) Filed: Jan. 27, 2022

(65) Prior Publication Data

US 2022/0246891 A1 Aug. 4, 2022

(30) Foreign Application Priority Data

Feb. 1, 2021 (KR) ........................ 10-2021-0014110

(51) Int. Cl.
*H10K 59/80* (2023.01)
*H10K 59/131* (2023.01)
*H10K 102/00* (2023.01)

(52) U.S. Cl.
CPC ....... *H10K 59/8791* (2023.02); *H10K 59/879* (2023.02); *H10K 59/131* (2023.02);
(Continued)

(58) Field of Classification Search
CPC .. H10K 50/86; H10K 50/8426; H10K 59/131; H10K 59/8791; H10K 59/879;
(Continued)

(56) References Cited

U.S. PATENT DOCUMENTS

2007/0146887 A1   6/2007  Ikeda et al.
2018/0277691 A1*  9/2018  Karkkainen ......... C09D 183/08
(Continued)

FOREIGN PATENT DOCUMENTS

JP   11-156987 A   6/1999
JP   4051740 B2    6/1999
(Continued)

OTHER PUBLICATIONS

Yiguang Wang, et al., "Oxygen Diffusion Through Al-Doped Amorphous $SIO_2$", Basic and Applied Research: Section I, 2006, pp. 671-675, vol. 27, No. 6, Journal of Phase Equilibria and Diffusion.

(Continued)

*Primary Examiner* — Jessica S Manno
*Assistant Examiner* — Andrew Chung
(74) *Attorney, Agent, or Firm* — Womble Bond Dickinson (US) LLP

(57) ABSTRACT

A display device includes a first substrate having, defined thereon, an active region and a nonactive region around the active region; an active element layer on a first surface of the first substrate and in the active region; a second substrate facing the first surface of the first substrate, the second substrate being on the active element layer; and an antireflection member on a first surface of the second substrate that faces the first substrate, the antireflection member being spaced apart from the active element layer, wherein the antireflection member includes first, second, third, and fourth refractive layers sequentially stacked from the first surface of the second substrate, refractive indexes of the first and third refractive layers are greater than refractive indexes of the second and fourth refractive layers, and the fourth refractive layer includes aluminum, indium, and/or gallium.

7 Claims, 25 Drawing Sheets

(52) U.S. Cl.
CPC ....... *H10K 59/871* (2023.02); *H10K 59/8723* (2023.02); *H10K 2102/00* (2023.02); *H10K 2102/351* (2023.02)

(58) Field of Classification Search
CPC ............. H10K 59/8723; H10K 59/871; H10K 2102/00; H10K 2102/351; H10K 59/65
See application file for complete search history.

(56) References Cited

U.S. PATENT DOCUMENTS

| | | | |
|---|---|---|---|
| 2019/0091970 A1* | 3/2019 | Ueki | B32B 23/08 |
| 2020/0117034 A1 | 4/2020 | Yin et al. | |
| 2020/0185643 A1 | 6/2020 | Moon et al. | |
| 2020/0203404 A1 | 6/2020 | Lee et al. | |
| 2020/0203405 A1 | 6/2020 | Lee et al. | |
| 2020/0394964 A1 | 12/2020 | Hyun et al. | |
| 2021/0202622 A1* | 7/2021 | Kim | H10K 50/865 |
| 2021/0305534 A1 | 9/2021 | Moon et al. | |
| 2021/0384234 A1 | 12/2021 | Lee et al. | |
| 2021/0397215 A1 | 12/2021 | Yin et al. | |
| 2022/0246884 A1* | 8/2022 | Yan | H10K 59/121 |
| 2022/0357625 A1* | 11/2022 | Nakatogawa | H10K 59/352 |

FOREIGN PATENT DOCUMENTS

| | | | | |
|---|---|---|---|---|
| KR | 10-2015-0052244 A | 5/2015 | | |
| KR | 10-2015-0057290 A | 5/2015 | | |
| KR | 10-2016-0146525 A | 12/2016 | | |
| KR | 10-2019-0059079 A | 5/2019 | | |
| KR | 10-2019-0093131 A | 8/2019 | | |
| KR | 10-2020-0002968 A | 1/2020 | | |
| KR | 10-2076266 B1 | 2/2020 | | |
| KR | 10-2020-0069421 A | 6/2020 | | |
| KR | 10-2020-0077953 A | 7/2020 | | |
| KR | 10-2020-0144193 A | 12/2020 | | |
| WO | WO-2021153082 A1 * | 8/2021 | ....... | G02F 1/133345 |

OTHER PUBLICATIONS

International Search Report and Written Opinion mailed Apr. 27, 2022, corresponds to PCT/KR2022/001092, 8 pages.

* cited by examiner

10: 100, ATL, SL, AR, 190

HLE: HLE_OP, HLE_TH1, HLE_TH2, HLE_TH3

DISPLAY DEVICE

CROSS-REFERENCE TO RELATED APPLICATION

This application claims priority to and the benefit of Korean Patent Application No. 10-2021-0014110, filed on Feb. 1, 2021, the entire content of which is incorporated herein by reference.

BACKGROUND

1. Field

Embodiments of the present disclosure relates to a display device.

2. Description of the Related Art

Electronic devices such as smartphones, tablet personal computers (PCs), digital cameras, notebook computers, navigation devices, and/or smart televisions (TVs) include a display device for displaying an image.

The display device includes a display panel and elements and/or parts for driving the display panel. Various additional elements and/or parts for realizing a variety of functions other than a display function are often installed in the display device. Examples of the display device equipped with the variety of functions may include a smartphone having optical elements such as a camera, an infrared sensor, and/or the like installed therein.

The display device may include one or more optical holes for receiving light for (e.g., transmitting light towards) optical devices. To improve the transmittance of the optical holes, the optical holes are physically penetrated by some of the members of the display device.

SUMMARY

An aspect according to one or more embodiments of the present disclosure is direction toward a display device capable of improving (e.g., reducing) the flare of light received by optical elements.

An aspect according to one or more embodiments of the present disclosure is direction toward a display device capable of preventing or substantially preventing the deterioration of an emission layer by oxygen and/or moisture released from the surface of an antireflection member.

However, embodiments of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment of the present disclosure, a display device includes a first substrate having, defined thereon, an active region and a nonactive region around the active region; an active element layer on a first surface of the first substrate and in the active region; a second substrate facing the first surface of the first substrate, the second substrate being on the active element layer; and an antireflection member on a first surface of the second substrate that faces the first substrate, the antireflection member being spaced apart from the active element layer, wherein the antireflection member includes first, second, third, and fourth refractive layers sequentially stacked from the first surface of the second substrate, refractive indexes of the first and third refractive layers are greater than refractive indexes of the second and fourth refractive layers, and the fourth refractive layer includes aluminum, indium, and/or gallium.

According to another embodiment of the present disclosure, a display device includes a display substrate having, defined thereon, a hole area, an active region surrounding the hole area, and a nonactive region around the active region; an active element layer on a first surface of the display substrate and in the active region; an encapsulation substrate facing the first surface of the display substrate, the encapsulation substrate being on the active element layer; an antireflection member on a first surface of the encapsulation substrate that faces the display substrate, the antireflection member being spaced apart from the active element layer; and an optical element below the display substrate and overlapping the hole area, wherein the active element layer includes a through hole overlapping with the hole area.

According to still another embodiment of the present disclosure, a display device includes a display substrate having, defined thereon, an active region and a nonactive region around the active region, the active region including a first active region and a second active region having a smaller area than the first active region; an active element layer on a first surface of the display substrate and in the active region; an encapsulation substrate facing the first surface of the display substrate, the encapsulation substrate being on the active element layer; an antireflection member on a first surface of the encapsulation substrate that faces the display substrate, the antireflection member being spaced apart from the active element layer; and an optical element below the display substrate to overlap with the second active region, wherein the antireflection member includes first, second, third, and fourth refractive layers sequentially stacked from the first surface of the encapsulation substrate, the first active region includes first pixels, the second active region includes second pixels, and a number of the second pixels per unit area of the second active region is smaller than a number of the first pixels per unit area of the first active area.

According to the aforementioned and other embodiments of the present disclosure, as an antireflection member is provided on a surface of a second substrate that faces a first substrate, the flare of light received by optical elements can be improved (e.g., reduced).

In addition, as the structure of the antireflection member is designed sophisticatedly, the deterioration of an emission layer by oxygen and/or moisture released from the surface of the antireflection member can be prevented, substantially prevented, or reduced.

Other features and embodiments may be apparent from the following detailed description, the drawings, and the claims.

BRIEF DESCRIPTION OF THE DRAWINGS

The above and other embodiments and features of the present disclosure will become more apparent by describing in more detail embodiments thereof with reference to the attached drawings, in which.

DETAILED DESCRIPTION

Figure 1:
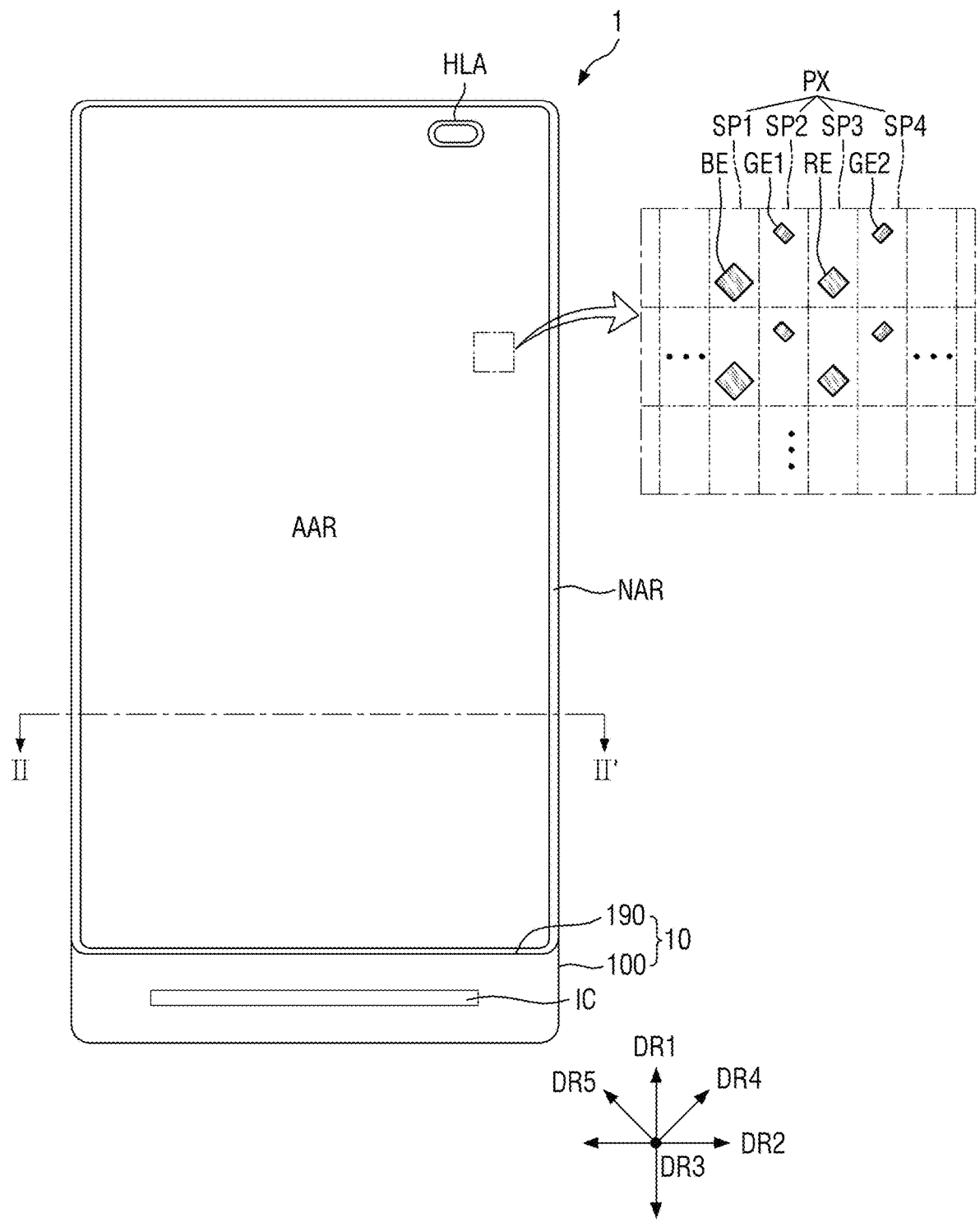
FIG. 1 is a plan view of a display device according to an embodiment of the present disclosure.

Specific structural and functional descriptions of embodiments of the present disclosure disclosed herein are only for illustrative purposes of the embodiments of the present disclosure. The subject matter of the present disclosure may be embodied in many different forms without departing from the spirit and significant characteristics of the present disclosure. Therefore, the embodiments of the present disclosure are disclosed only for illustrative purposes and should not be construed as limiting the subject matter of the present disclosure. That is, the subject matter of the present disclosure is only defined by the scope of the claims, and equivalents thereof.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts. The use of "may" when describing embodiments of the present disclosure refers to "one or more embodiments of the present disclosure."

It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first "element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises," "comprising," "includes," and/or "including," when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower," "bottom," "upper," or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The example term "lower" can therefore encompasses both an orientation of "lower" and "upper," depending on the particular orientation of the figure. Similarly, if the device in one of the figures is turned over, elements described as "below" or "beneath" other elements would then be oriented "above" the other elements. The example terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments are described herein with reference to cross section illustrations that are schematic illustrations of idealized embodiments. As such, variations from the shapes of the illustrations as a result of, for example, manufacturing techniques and/or tolerances, are to be expected. Thus, embodiments described herein should not be construed as limited to the particular shapes of regions as illustrated herein but are to include deviations in shapes that result from, for example, manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described with reference to the attached drawings.

Figure 2:
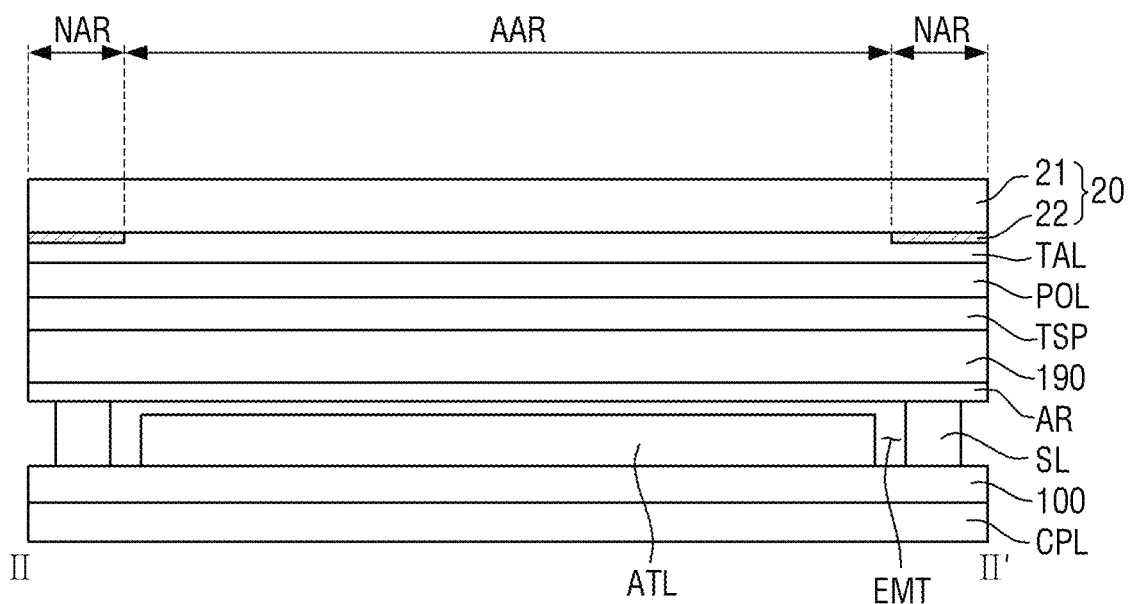
FIG. 2 is a cross-sectional view taken along the line II-II' of FIG. 1.
Figure 2:
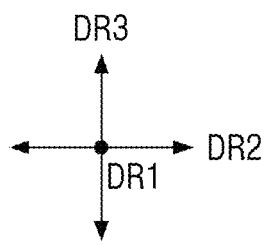

FIG. 1 is a plan view of a display device according to an embodiment of the present disclosure. FIG. 2 is a cross-sectional view taken along the line II-II' of FIG. 1. For example, FIG. 2 illustrates a cross-sectional view of the display device of FIG. 1.

First and second directions DR1 and DR2 may be, for example, different directions crossing each other at a right angle in a plan view. A third direction DR3 may be, for example, a direction crossing both the first and second directions DR1 and DR2. The first direction DR1 may refer to the vertical direction of a display device 1, the second direction DR2 may refer to the horizontal direction of the display device 1, and the third direction DR3 may refer to the thickness direction of the display device 1.

A first side in the first direction DR1 may refer to an upward direction in a plan view, a second side in the first direction DR1 may be a downward direction in a plan view, a first side in the second direction DR2 may refer to a rightward direction in a plan view, a second side in the second direction DR2 may refer to a leftward direction in a plan view, a first side in the third direction DR3 may refer to an upward direction in a cross-sectional view, and a second side in the third direction DR3 may refer to a downward direction in a cross-sectional view. Unless specified otherwise, the terms "upper", "top surface", "on", "above", and/or the like as used herein, may refer to a display surface's side of a display panel 10, and the terms "lower", "bottom surface", "below", and/or the like as used herein, may refer to a side of the display panel 10 that is opposite to the display surface. However, directions set forth herein should be understood as being relative directions, and are not particularly limited.

Referring to FIGS. 1 and 2, the display device 1 may display a moving image and/or a still image. In a case where the display device 1 is, for example, a front emission display device, the display direction of a main screen may correspond to the first side in the third direction DR3, but the present disclosure is not limited thereto.

The display device 1 may refer to nearly all types (e.g., kinds) of electronic devices that provide a display screen. Examples of the display device 1 may include not only portable electronic devices such as a mobile phone, a smartphone, a tablet personal computer (PC), an electronic watch, a watchphone, a mobile communication terminal, an electronic notepad, an electronic book reader, a portable multimedia player (PMP), a navigation device, a gaming console, a digital camera, and/or the like, but also a television (TV), a notebook computer, an electronic billboard, and/or the like.

The display device 1 includes an active region AAR and a nonactive region NAR. If part of the display device 1 that displays a screen (e.g., an image) is defined as a display area and part of the display device 1 that does not display a screen (e.g., an image) is defined as a non-display area, the display area may be included in the active region AAR. In a case where the display device 1 has a touch function, a touch area where touch input can be detected may also be included in the active region AAR. The display area and the touch area may overlap. The active region AAR may be a region where both the display of an image and the detection of a touch input are performed.

The active region AAR may include pixels PX for displaying an image. Each of the pixels PX may include first, second, third, and fourth subpixels SP1, SP2, SP3, and SP4. The first, second, third, and fourth subpixels SP1, SP2, SP3, and SP4 may be arranged in the second direction DR2.

The first subpixel SP1 may include a first emission area BE, which emits light of a first color. The second subpixel SP2 may include a second emission area GE1, which emits light of a second color. The third subpixel SP3 may include a third emission area RE, which emits light of a third color. The fourth subpixel SP4 may include a fourth emission area GE2, which emits light of a fourth color.

The first emission areas BE, the second emission areas GE1, the third emission areas RE, and the fourth emission areas GE2 may emit light of different colors. In some embodiments, the first emission areas BE, the second emission areas GE1, the third emission areas RE, and the fourth emission areas GE2 may emit light of the same color. In some embodiments, the second emission areas GE1 and the fourth emission areas GE2 may emit light of the same color.

The first emission areas BE, the second emission areas GE1, the third emission areas RE, and the fourth emission areas GE2 may have a rectangular shape in a plan view, but the present disclosure is not limited thereto. In some embodiments, the first emission areas BE, the second emission areas GE1, the third emission areas RE, and the fourth emission areas GE2 may have a nontetragonal polygonal shape, a circular shape, or an elliptical shape in a plan view. The first emission areas BE may have a largest size and the second emission areas GE1 and the fourth emission areas GE2 may have the same size and a smallest size. However, the present disclosure is not limited thereto.

The second emission areas GE1 and the fourth emission areas GE2 may be alternately arranged in the second direction DR2. The second emission areas (e.g., a plurality of second emission areas) GE1 may be arranged in the first direction DR1. The fourth emission areas (e.g., a plurality of fourth emission areas) GE2 may be arranged in the first direction DR1. Each of the fourth emission areas GE2 may have long sides in a fourth direction DR4 and short sides in a fifth direction DR5, and each of the second emission areas GE2 may have long sides in the fifth direction DR5 and short sides in the fourth direction DR4. The fourth direction DR4 may be a diagonal direction between the first and second directions DR1 and DR2, and the fifth direction DR5 may be a direction intersecting the fourth direction DR4.

The first emission areas BE and the third emission areas RE may be alternately arranged in the second direction DR2. The first emission areas (e.g., a plurality of first emission areas) BE may be arranged in the first direction DR1. The third emission areas (e.g., a plurality of third emission areas) RE may be arranged in the first direction DR1. The first emission areas BE and the third emission areas RE may be located lower than the second emission areas GE1 and the fourth emission areas GE2 in their respective rows of subpixels (SP1, SP2, SP3, and SP4). The first emission areas BE and the third emission areas RE may have a rhombus shape in a plan view, in which case, the first emission areas BE and the third emission areas RE may each have a pair of parallel sides in the fourth direction DR4 and a pair of parallel sides in the fifth direction DR5.

For example, FIG. 1 illustrates that the second emission areas GE1 and the fourth emission areas GE2 are alternately arranged in the second direction DR2, the first emission areas BE and the third emission areas RE are alternately arranged in the second direction DR2, the first emission areas BE and the third emission areas RE are located lower than the second emission areas GE1 and the fourth emission areas GE2 in their respective rows of subpixels (SP1, SP2, SP3, and SP4), and the first emission areas BE, the second emission areas GE1, the third emission areas RE, and the fourth emission areas GE2 may be arranged in a zigzag fashion in the second direction DR2, but the pattern of arrangement of the first emission areas BE, the second emission areas GE1, the third emission areas RE, and the fourth emission areas GE2 is not particularly limited, but may suitably vary.

Figure 6:
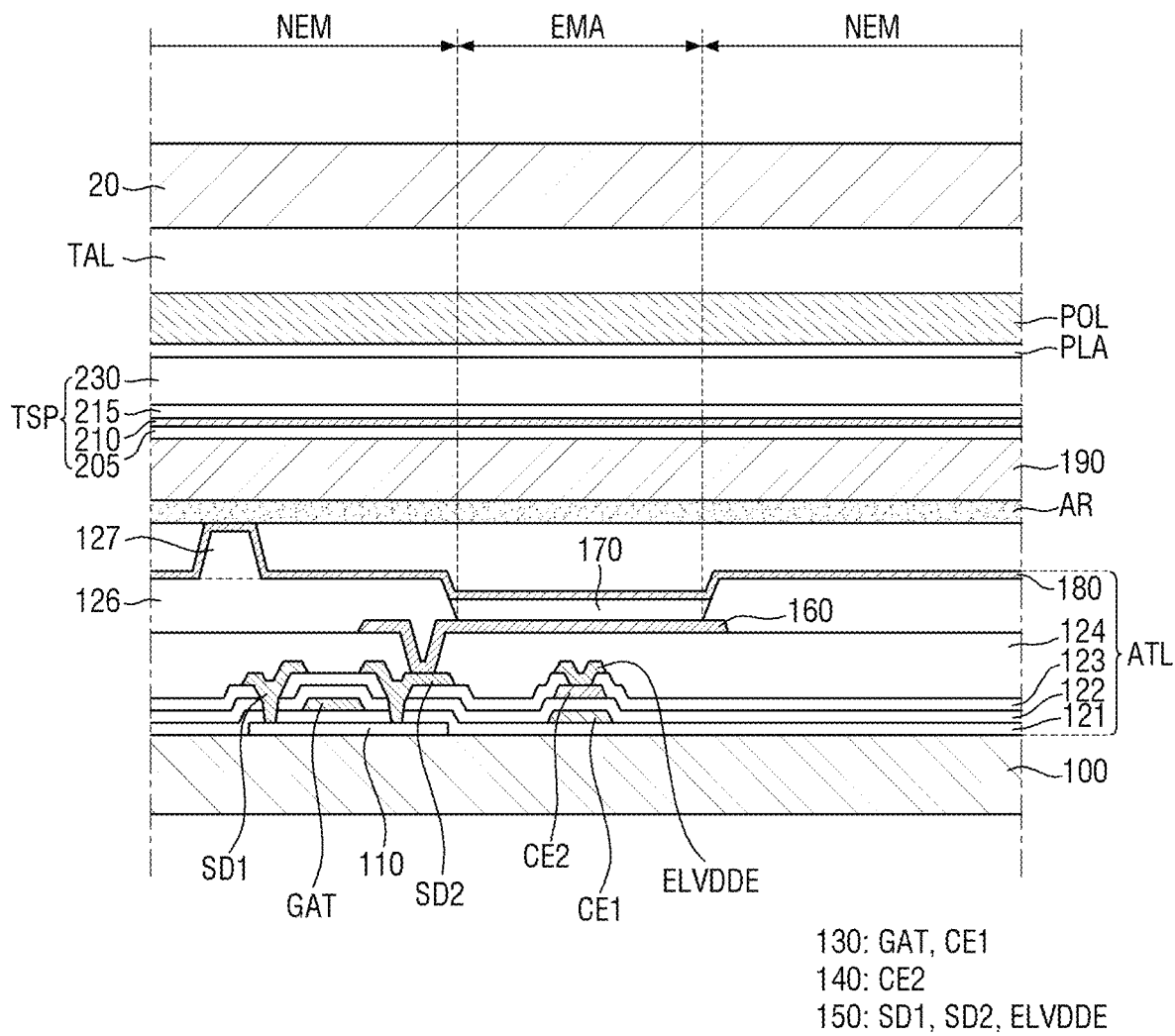
FIG. 6 is a cross-sectional view of a subpixel of the display device of FIG. 1.

Each of the subpixels (SP1, SP2, SP3, and SP4) may include an emission area EMA (see FIG. 6) and a non-emission area NEM (see FIG. 6).

The nonactive region NAR may be around the active region AAR. The nonactive region NAR may be a bezel region. The nonactive region NAR may overlap with a printed layer 22 (see FIG. 2) of a window member 20 (see FIG. 2).

The nonactive region NAR may surround all the sides (e.g., four sides) of the active region AAR, but the present disclosure is not limited thereto. The nonactive region NAR may not be located near the upper side of the active region AAR.

Signal lines and/or driving circuits for applying signals to the active region AAR (or the display area or the touch area) may be in the nonactive region NAR. In one embodiment, a driving chip IC may be in the nonactive region NAR. The driving chip IC may include an integrated circuit for driving the display panel 10. The integrated circuit may include an integrated circuit for a display and/or an integrated circuit for a touch member TSP. The driving chip IC may be mounted directly on a protrusion of the first substrate 100 that protrudes with respect to a second substrate 190.

The display device 1 may further include a hole area HLA, which includes at least one hole (e.g., "HLE" of FIG. 4), in the active region AAR.

FIG. 2 is a cross-sectional view taken along the line II-II' of FIG. 1. The cross-sectional structure of the display device 1 will hereinafter be described with reference to FIGS. 1 and 2.

The display device 1 may include the display panel 10, which provides a display screen, the touch member TSP, a polarizing member POL, the window member 20, and a cover panel CPL, which is below the display panel 10. Some of the elements of the display device 1 except for the display panel 10 may not be provided or may be replaced with other elements.

The display panel 10 may be, for example, an organic light-emitting display panel, a micro-light-emitting diode (LED) display panel, a nano-LED display panel, a quantum-dot LED display panel, a liquid crystal display panel, a plasma display panel (PDP), a field emission display (FED) panel, an electrophoretic display (EPD) panel, and/or an electrowetting display panel. The display panel 10 will hereinafter be described as being, for example, an organic light-emitting display panel, but the present disclosure is not limited thereto. Various other suitable display panels may also be applicable to the display device 1.

The display panel 10 may include a first substrate 100, a second substrate 190, an active element layer ATL, an antireflection member AR, and a sealing member SL.

The first substrate 100 may support the active element layer ATL. The first substrate 100 may have a high light transmittance. The first substrate 100 may include an inorganic material such as glass and/or quartz, but the present disclosure is not limited thereto. In some embodiments, the first substrate 100 may include an organic material for forming a transparent plate or a transparent film.

The second substrate 190 may face the first substrate 100 and may be spaced apart from the first substrate 100. The second substrate 190 may protect the active element layer ATL from external moisture and/or the air. The second substrate 190 may have a high light transmittance. The second substrate 190 may include an inorganic material such as glass and/or quartz, but the present disclosure is not limited thereto.

The active element layer ATL may be between the first and second substrates 100 and 190. The active element layer ATL may be on the top surface (or a first surface) of the first substrate 100. The active element layer ATL may include light-emitting elements and thin-film transistors (TFTs) for driving the light-emitting elements. The active element layer ATL may be spaced apart from the second substrate 190, but the present disclosure is not limited thereto. The active element layer ATL will be described in more detail herein below.

The antireflection member AR may be between the first and second substrates 100 and 190. The antireflection member AR may be on the bottom surface (or a second surface) of the second substrate 190. The bottom surface of the second substrate 190 may face the top surface of the first substrate 100. The antireflection member AR may be in at least the hole area HLA. In some embodiments, the antireflection member AR may be not only in the hole area HLA, but also in the entire active region AAR, and may be even in the nonactive region NAR surrounding the active region AAR. For example, the antireflection member AR may overlap with the sealing member SL.

The antireflection member AR may be on the bottom surface of the second substrate 190 to reduce the amount of light reflected from the interface with the second substrate 190, and as a result, the amount of light passing through the second substrate 190 may increase. This will be described in more detail herein below.

The sealing member SL may be between the first and second substrates 100 and 190. In one embodiment, the sealing member SL may be in the nonactive region NAR of the display device 1 to surround the active region AAR. The sealing member SL may bond the first and second substrates 100 and 190 and may seal the active element layer ATL as well as the first and second substrates 100 and 190. In one embodiment, the sealing member SL may include frit, but the present disclosure is not limited thereto.

The active element layer ATL and the antireflection member AR may be in the display panel 10, which is defined by the first substrate 100, the second substrate 190, and the sealing member SL. A gap EMT may be provided between the active element layer ATL and the antireflection member AR, inside the display panel 10. The gap EMT may be vacuum or filled with a gas and/or the like. The gas may be, for example, an inert gas or the atmosphere (atmospheric air). The gap EMT may be filled not only with the gas, but also with a filler. The gap EMT may overlap with a first through hole HLE_TH1 (see FIG. 4).

The touch member TSP may be on the display panel 10. The touch member TSP may detect touch inputs. The touch member TSP may be on the top surface (or a first surface) of the second substrate 190. The touch member TSP may be incorporated into the display panel 10 in the form of a touch layer, but the present disclosure is not limited thereto. In some embodiments, the touch member TSP may be provided as a separate touch panel or film and may be attached on the display panel 10. The touch member TSP may include a plurality of touch electrodes. In some embodiments, the touch member TSP may not be provided.

The polarizing member POL polarizes light passing therethrough. The polarizing member POL may reduce the reflection of external light. The polarizing member POL may be attached on the touch member TSP through a polarizing bonding layer. In some embodiments, the touch member TSP is not provided, and the polarizing member POL may be attached on the second substrate 190.

In some embodiments, the polarizing member POL may not be provided, and an element having the same functions as the polarizing member POL may be on the touch member TSP. In one embodiment, the element having the same functions as the polarizing member POL may be a black matrix located between color filters.

The window member 20 is on the polarizing member POL. The window member 20 covers and protects the display panel 10. The window member 20 may include a window base 21 and a printed layer 22, which is on the window base 21. The window member 20 may be attached on a first surface of the display panel 10 via a transparent bonding layer TAL including an optically clear adhesive (OCA) and/or an optically clear resin (OCR). In a case where the display device 1 includes the polarizing member POL, the window member 20 may be attached on the top surface (or a first surface) of the polarizing member POL.

The window base 21 may be formed of a transparent material. The window base 21 may include, for example, glass and/or plastic.

The planar shape of the window base 21 may correspond to the planar shape of the display device 1. In one embodiment, in a case where the display device 1 has a substantially rectangular shape in a plan view, the window base 21 may also have a substantially rectangular shape in a plan view. In another embodiment, in a case where the display device 1 has a circular shape, the window base 21 may also have a circular shape.

The printed layer 22 may be on the window base 21. The printed layer 22 may be on a first surface and/or a second surface of the window base 21. The printed layer 22 may be on the edges of the window base 21, and in the nonactive region NAR. The printed layer 22 may also be in the hole area HLA. The printed layer 22 may be a light-blocking layer and/or a decorative layer for an aesthetic effect. The hole area HLA of the display device 1 will hereinafter be described in more detail.

Figure 3:
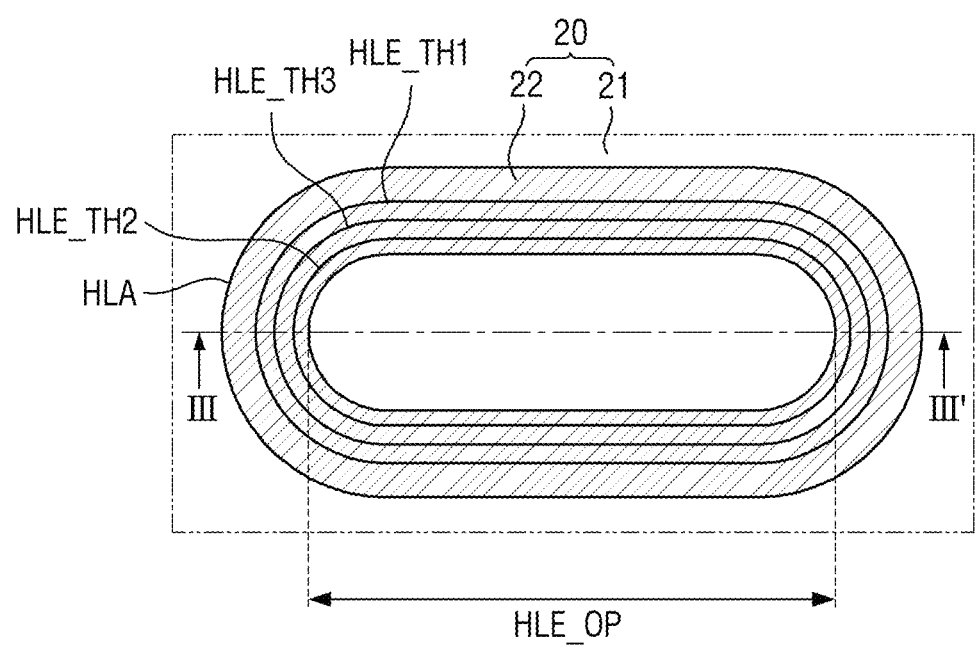
FIG. 3 is a plan view illustrating the layout of elements near a hole area of FIG. 1.
Figure 4:
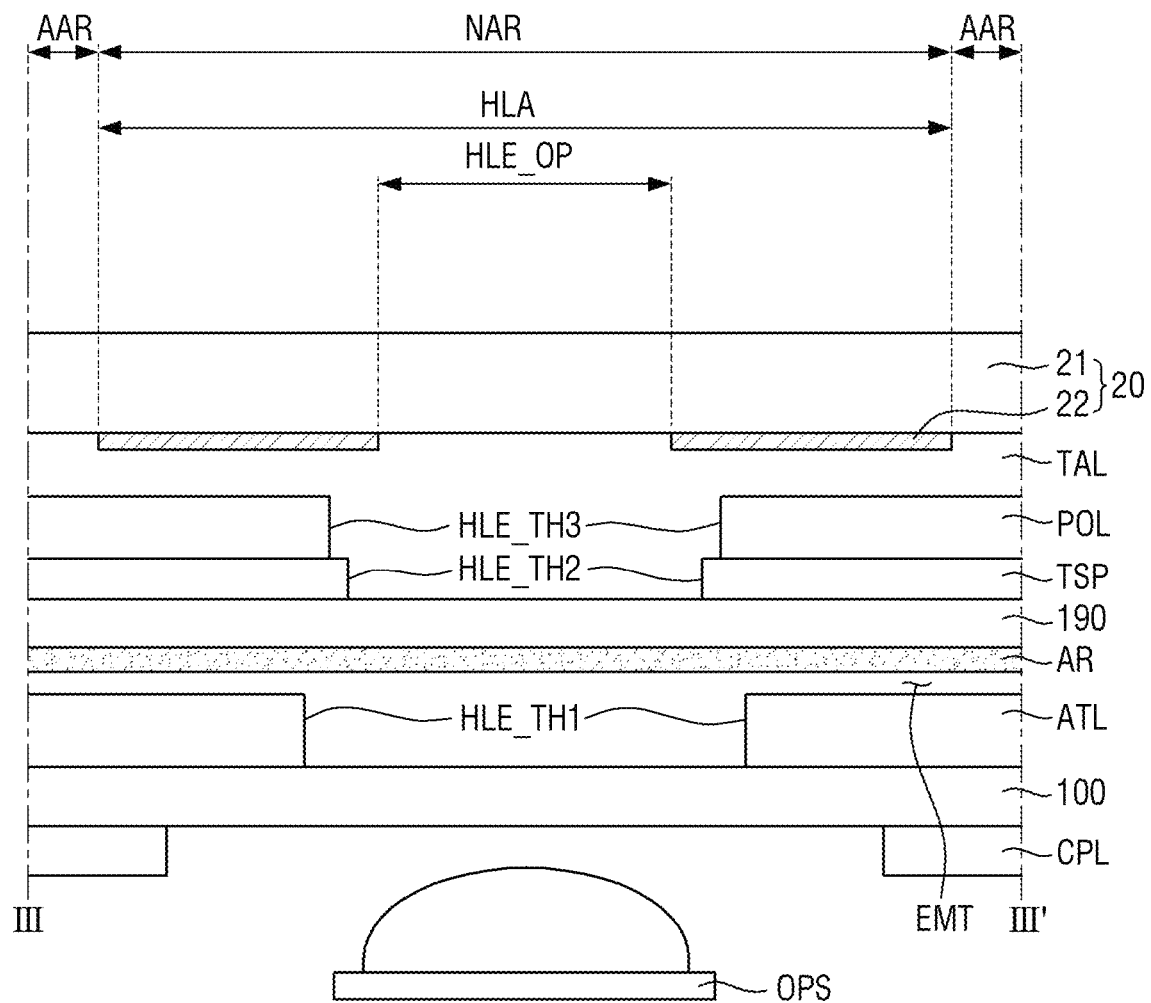
FIG. 4 is a cross-sectional view taken along the line III-III' of FIG. 3 according to an embodiment.

FIG. 3 is a plan view illustrating the layout of elements near the hole area HLA of FIG. 1. FIG. 4 is a cross-sectional view taken along the line III-III' of FIG. 3 according to an embodiment. FIG. 4 is a cross-sectional view illustrating the surroundings of the hole area of the display device of FIG. 1.

Referring to FIGS. 1 through 4, the hole area HLA may be located toward the first side of the display device 1. The hole area HLA may be part of the nonactive region NAR where the display of an image and/or the detection of touch input is not performed. The hole area HLA may be inside the active region AAR. For example, the hole area HLA may be surrounded by the active region AAR, as illustrated in FIG. 1. In some embodiments, the hole area HLA may be surrounded by the nonactive region NAR or may be at the boundary between the active region AAR and the nonactive region NAR so that part of the hole area HLA may be surrounded by the active region AAR and part of the hole area HLA may be surrounded by the nonactive region NAR.

The hole area HLA may have a circular shape, an elliptical shape, a dumbbell shape, or a rectangular shape with bulging short sides in a plan view, but the present disclosure is not limited thereto. In some embodiments, the hole area HLA may have various other suitable shapes such as a rectangular shape, a square shape, or a nontetragonal polygonal shape in a plan view.

The hole area HLA may include one or more holes HLE. The planar shape of the holes HLE may correspond to the planar shape of the hole area HLA, but the present disclosure is not limited thereto. In some embodiments, the holes HLE may have various other suitable shapes such as a circular shape or an elliptical shape in a plan view.

The holes HLE may include through holes HLE_TH. The through holes HLE_TH may have an elliptical shape in a plan view, but the present disclosure is not limited thereto. The through holes HLE_TH may include the first through hole HLE_TH1, which physically penetrates the active element layer ATL of the display panel 10, a second through hole HLE_TH2, which physically penetrates the touch member TSP, and a third through hole HLE_TH3, which physically penetrates the polarizing member POL. Due to the presence of the through holes HLE_TH, the light transmittance in the through holes HLE_TH can be improved.

The first, second, and third through holes HLE_TH1, HLE_TH2, and HLE_TH3 may overlap at least in part with one another. As a result, an optical path for external light to be incident upon an optical element OPS can be secured.

In a plan view, the second and third through holes HLE_TH2 and HLE_TH3 may be surrounded by the first through hole HLE_TH1, and the second through hole HLE_TH2 may be surrounded by the third through hole HLE_TH3. However, the present disclosure is not limited thereto. The planar sizes (or diameters) and the pattern of arrangement of the first, second, and third through holes HLE_TH1, HLE_TH2, and HLE_TH3 may suitably vary.

The first through hole HLE_TH1 of the active element layer ATL may be empty or may be filled with the gas present in the gap EMT. The second through hole HLE_TH2 of the touch member TSP and the third through hole HLE_TH3 of the polarizing member POL may be filled with an OCR.

The first and second substrates 100 and 190 of the display panel 10, the touch member TSP, and the window member 20 may not be physically penetrated in an area that overlaps with the through holes HLE_TH. As already mentioned above, as the first and second substrates 100 and 190 of the display panel 10 already have a high light transmittance, the display panel 10 can maintain a high light transmittance in the area that overlaps with the through holes HLE_TH. As a touch conductive layer 210 (see FIG. 6) of the touch member TSP is not in the area that overlaps with the through holes HLE_TH and a touch base layer 205 (see FIG. 6) of the touch member TSP already has a high light transmittance in the area that overlaps with the through holes HLE_TH, the touch member TSP can maintain a high light transmittance in the area that overlaps with the through holes HLE_TH. As the window base 21 of the window member 20 already has a high light transmittance, the window member 20 can maintain a high light transmittance in the area that overlaps with the through holes HLE_TH, even though the window member 20 is not penetrated by the through holes HLE_TH. Also, as the window member 20 is not penetrated, but covers the area that overlaps with the through holes HLE_TH, the window member 20 can protect the elements therebelow.

The hole area HLA may further include an optical hole HLE_OP, which transmits light therethrough. The optical hole HLE_OP may overlap with the through holes HLE_TH and may be defined by the pattern of the printed layer 22 of the window member 20. The printed layer 22 may be in part in the hole area HLA to block the output of light from the pixels PX through the through holes HLE_TH (i.e., light leakage). The printed layer 22 may be even on the outside of the hole area HLA, but the present disclosure is not limited thereto.

The printed layer 22 may be near the through holes HLE_TH to expose at least parts of the through holes HLE_TH. The parts of the through holes HLE_TH exposed by the printed layer 22 may correspond to the optical hole HLE_OP, which transmits light therethrough. In one embodiment, the printed layer 22 of the hole area HLA may partially overlap with the through holes HLE_TH. For example, an inner side surface of the printed layer 22 may be inwardly projected beyond (e.g., may inwardly extend beyond) the inner sidewalls of the through holes HLE_TH. The inner side surface of the printed layer 22 may be aligned with, or located within the inner sidewall of whichever of the through holes HLE_TH has a smallest diameter (e.g., in a plan view). Accordingly, the inner sidewalls of the first, second, and third through holes HLE_TH1, HLE_TH2, and HLE_TH3 may be hidden by the printed layer 22 and may thus not be viewed from outside.

The display device 1 may further include the optical element OPS, which includes a light-receiving part. Examples of the optical element OPS may include a camera, a lens (e.g., a condensing lens, an optical path guide lens, and/or the like), and an optical sensor (e.g., an infrared sensor, an iris sensor, an illuminance sensor, and/or the like). The optical element OPS may be located on a second surface of the display panel 10 to overlap with the hole area HLA. The light-receiving part of the optical element OPS may be located at least in part in the optical hole HLE_OP. Light from outside the display device 1 may pass through part of the window base 21 surrounded by the printed layer 22 and may then be incident upon the light-receiving part of the optical element OPS through the through holes HLE_TH, the second substrate 190 of the display panel 10, and the first substrate 100 of the display panel 10. As already mentioned above, in a case where the window base 21 and the first and second substrates 100 and 190 of the display panel 100 have a high light transmittance, external light can reach the light-receiving part of the optical element OPS through the above-described optical path almost without any substantial loss.

The display device 1 may further include a cover panel CPL. The cover panel CPL may be on the second surface of the first substrate 100. The cover panel CPL may include a heat dissipation layer, a cushion layer, and/or the like. The cover panel CPL may not be in an area that overlaps with the optical hole HLE_OP and/or the through holes HLE_TH.

The cross-sectional structure of the circuitry of one subpixel of the display device 1 will hereinafter be described in more detail.

Figure 5:
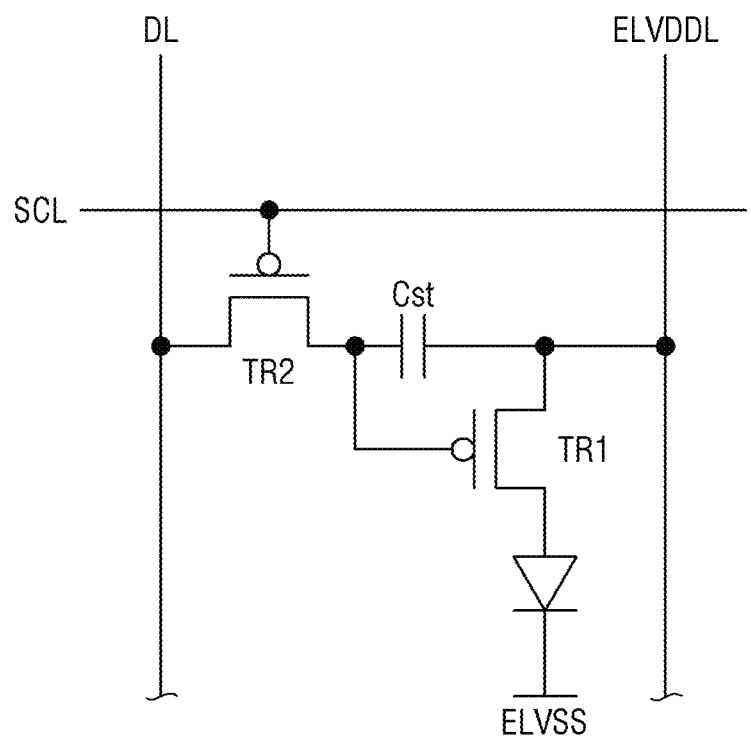
FIG. 5 is a circuit diagram of a subpixel of the display device of FIG. 1.

FIG. 5 is a circuit diagram of a subpixel of the display device of FIG. 1.

Referring to FIG. 5, a subpixel of the display device 1 may include a first transistor TR1, a second transistor TR2, a capacitor Cst, and an organic light-emitting diode (OLED). A scan line SCL, a data line DL, and a first power supply voltage line ELVDDL are connected to the subpixel.

The first transistor TR1 may be a driving transistor, and the second transistor TR2 may be a switching transistor. The first and second transistors TR1 and TR2 are illustrated as being P-type metal-oxide semiconductor (PMOS) transistors, but the present disclosure is not limited thereto. In some embodiments, at least one selected from the first and second transistors TR1 and TR2 may be an N-type metal-oxide semiconductor (NMOS) transistor.

The first electrode (or the source electrode) of the first transistor TR1 may be connected to the first power supply voltage line ELVDDL, and the second electrode (or the drain electrode) of the first transistor TR1 may be connected to the anode electrode of the OLED. The first electrode (or the source electrode) of the second transistor TR2 may be connected to the data line DL, and the second electrode (or the drain electrode) of the second transistor TR2 may be connected to the gate electrode of the first transistor TR1. The capacitor Cst may be connected between the gate electrode and the first electrode of the first transistor TR1. The cathode electrode of the OLED may receive a second power supply voltage ELVSS. The second power supply voltage ELVSS may be lower than a first power supply voltage ELVDD from the first power supply voltage line ELVDDL.

The second transistor TR2 may output a data signal applied to the data line DL in response to a scan signal applied to the scan line SCL. The capacitor Cst may be charged with a voltage corresponding to the data signal received from the second transistor TR2. The first transistor TR1 may control a driving current that flows in the OLED, in accordance with the amount of charge stored in the capacitor Cst.

The circuitry of the subpixel shown in FIG. 5 is merely an example and the circuitry of the subpixel may include more than two transistors (e.g., seven transistors) and more than one capacitor.

Figure 7:
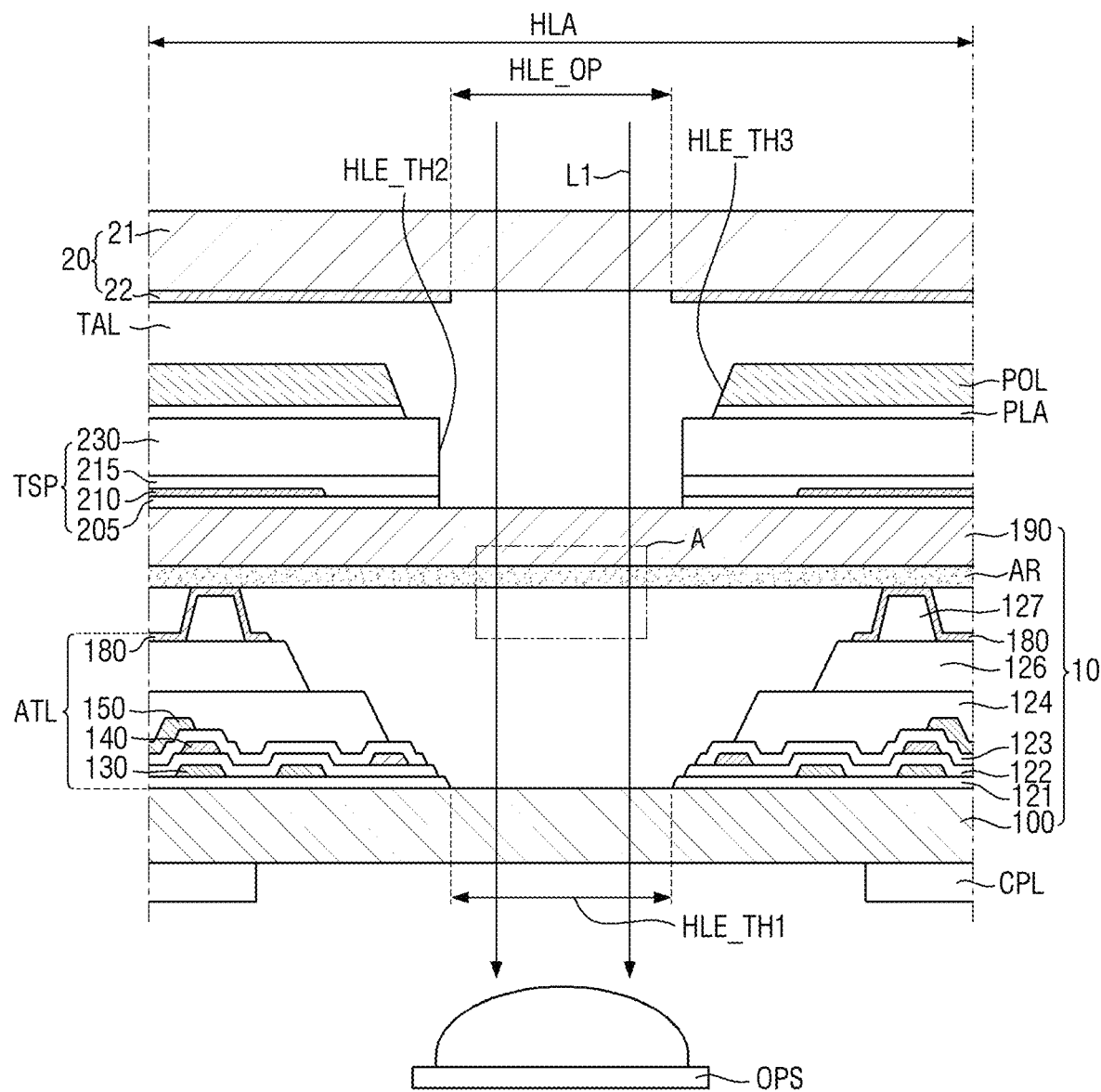
FIG. 7 is a detailed cross-sectional view taken along the line III-III' of FIG. 3 according to an embodiment.

FIG. 6 is a cross-sectional view of a subpixel of the display device of FIG. 1. FIG. 7 is a detailed cross-sectional view taken along the line III-III' of FIG. 3 according to an embodiment. The elements of the display device 1 will hereinafter be described in more detail with reference to FIGS. 6 and 7.

Referring to FIGS. 6 and 7, the active element layer ATL may cover the entire first substrate 100 except for, for example, the first through hole HLE_TH1. The active element layer ATL may include a semiconductor layer 110, a first insulating layer 121, a first gate conductive layer 130, a second insulating layer 122, a second gate conductive layer 140, a third insulating layer 123, a data conductive layer 150, a fourth insulating layer 124, an anode electrode 160, a bank layer 126, which includes an opening that exposes the anode electrode 160, an emission layer 170, which is in the opening of the bank layer 126, and a cathode electrode 180, which is on the emission layer 170 and the bank layer 126. The semiconductor layer 110, the first insulating layer 121, the first gate conductive layer 130, the second insulating layer 122, the second gate conductive layer 140, the third insulating layer 123, the data conductive layer 150, the fourth insulating layer 124, the anode electrode 160, the bank layer 126, and the cathode electrode 180 may be sequentially deposited. Also, the semiconductor layer 110, the first insulating layer 121, the first gate conductive layer 130, the second insulating layer 122, the second gate conductive layer 140, the third insulating layer 123, the data conductive layer 150, the fourth insulating layer 124, the anode electrode 160, the bank layer 126, and the cathode electrode 180 may each be formed as a single film or as a stack of multiple films. There may exist other layers between the semiconductor layer 110, the first insulating layer 121, the first gate conductive layer 130, the second insulating layer 122, the second gate conductive layer 140, the third insulating layer 123, the data conductive layer 150, the fourth insulating layer 124, the anode electrode 160, the bank layer 126, and the cathode electrode 180.

The semiconductor layer 110 is on the first substrate 100. The semiconductor layer 110 may form the channel of a TFT of the subpixel. The semiconductor layer 110 may include polycrystalline silicon, but the present disclosure is not limited thereto. In some embodiments, the semiconductor layer 110 may include monocrystalline silicon, low-temperature polycrystalline silicon, amorphous silicon, and/or an oxide semiconductor.

The first insulating layer 121 is on the semiconductor layer 110. The first insulating layer 121 may be a first gate insulating film having a gate insulating function. The first insulating layer 121 may include a silicon compound, a metal oxide, and/or the like.

The first gate conductive layer 130 is on the first insulating layer 121. The first gate conductive layer 130 may include a gate electrode GAT of the TFT of the subpixel, a scan line connected to the gate electrode GAT, and a first electrode CE1 of a storage capacitor.

The first gate conductive layer 130 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second insulating layer 122 may be on the first gate conductive layer 130. The second insulating layer 122 may be an interlayer insulating film or a second gate insulating film.

The second gate conductive layer 140 is on the second insulating layer 122. The second gate conductive layer 140 may include a second electrode CE2 of the storage capacitor. The second gate conductive layer 140 may include at least one metal selected from among Mo, Al, Pt, Pd, Ag, Mg, Au, Ni, Nd, Ir, Cr, Ca, Ti, Ta, W, and Cu.

The third insulating layer 123 is on the second gate conductive layer 140. The third insulating layer 123 may be an interlayer insulating film.

The data conductive layer 150 is on the third insulating layer 123. The data conductive layer 150 may include first and second electrodes SD1 and SD2 of the TFT of the subpixel. The first and second electrodes SD1 and SD2 may be electrically connected to source and drain regions of the semiconductor layer 110 through contact holes that penetrate the third insulating layer 123, the second insulating layer 122, and the first insulating layer 121. A first power supply voltage electrode ELVDDE of the subpixel may be formed by the data conductive layer 150. The first power supply voltage electrode ELVDDE may be electrically connected to the second electrode CE2 through a contact hole that penetrates the third insulating layer 123.

The data conductive layer 150 may include at least one metal selected from among Al, Mo, Pt, Pd, Ag, Mg, Au, Ni, Nd, Ir, Cr, Ca, Ti, Ta, W, and Cu. The data conductive layer 150 may be a single film or a multifilm (e.g., a multilayer film).

The fourth insulating layer 124 is on the data conductive layer 150. The fourth insulating layer 124 covers the data conductive layer 150. The fourth insulating layer 124 may be a via layer. The fourth insulating layer 124 may include an organic insulating material such as an acrylic resin, an epoxy resin, a phenolic resin, a polyamide resin, a polyimide resin, an unsaturated polyester resin, a polyphenylene resin, a polyphenylene sulfide resin, and/or benzocyclobutene (BCB).

The anode electrode 160 is on the fourth insulating layer 124. The anode electrode 160 may be a pixel electrode provided in each subpixel. The anode electrode 160 may be connected to the second electrode SD2 through a contact hole that penetrates the fourth insulating layer 124. The anode electrode 160 may at least partially overlap with an emission area EMA of the subpixel.

The anode electrode 160 may have a structure in which a high-work function material layer formed of indium tin oxide (ITO), indium zinc oxide (IZO), zinc oxide (ZnO), and/or indium oxide ($In_2O_3$) and a reflective material layer formed of Ag, Mg, Al, Pt, lead (Pb), Au, Ni, Nd, Ir, Cr, lithium (Li), Ca, or a mixture thereof are stacked. The high-work function material layer may be above the reflective material layer, close (e.g., closer) to the emission layer 170. The anode electrode 160 may have a multilayer structure such as ITO/Mg, ITO/MgF, ITO/Ag, or ITO/Ag/ITO, but the present disclosure is not limited thereto.

The bank layer 126 may be on the anode electrode 160. The bank layer 126 may include an opening, which exposes the anode electrode 160 from above the anode electrode 160. Due to the presence of the bank layer 126 and the opening, the emission area EMA and a non-emission area NEM may be defined. The bank layer 126 may include an organic insulating material such as an acrylic resin, an epoxy resin, a phenolic resin, a polyamide resin, a polyimide resin, an unsaturated polyester resin, a polyphenylene resin, a polyphenylene sulfide resin, and/or BCB. In some embodiments, the bank layer 126 may include an inorganic material.

The display device 1 may further include a spacer 127. The spacer 127 may be on the bank layer 126. In some embodiments, the spacer 127 may be directly on the bank layer 126. The spacer 127 may overlap with the bank layer 126 in a thickness direction. The spacer 127 may maintain the gap or distance between the element thereabove and the element therebelow. In one embodiment, the spacer 127 may prevent or substantially prevent a fine metal mask FMM from sagging during the deposition of an organic material to form the emission layer 170. The spacer 127 may support the structure deposited thereabove and may alleviate any or substantially any deformation of the display panel 10 that may be caused by stress when pressure is applied to the display panel 10. The spacer 127 may have a smaller width than the bank layer 126. The spacer 127 may be only on part of the bank layer 126, and as a result, a height difference may be formed between a region where the spacer 127 is not provided and a region where the spacer 127 is provided.

The spacer 127, similar to the bank layer 126, may include an organic insulating material. The spacer 127 may be formed as a separate layer from the bank layer 126, but the bank layer 126 and the spacer 127 may be formed of the same material by a single process. In one embodiment, the bank layer 126 and the spacer 127, which have different heights, may be formed by a single process of applying a photosensitive organic material and then performing exposure and development utilizing a slit mask and a halftone mask.

The emission layer 170 is on part of the anode electrode 160 exposed by the bank layer 126. The emission layer 170 may include an organic material layer. The organic material layer of the emission layer 170 may include an organic light-emitting layer and may further include a hole injection/transport layer and/or an electron injection/transport layer.

The cathode electrode 180 may be on the emission layer 170. The cathode electrode 180 may be a common electrode, which is a full electrode for all pixels. The anode electrode 160, the emission layer 170, and the cathode electrode 180 may form an organic light-emitting element.

The cathode electrode 180 may be in contact not only with the emission layer 170, but also with the top surface of the bank layer 126. The cathode electrode 180 may be in contact with the surface of the spacer 127 and may cover the surface of the spacer 127. The cathode electrode 180 may be conformally formed to reflect any height difference in the structure therebelow.

The cathode electrode 180 may include a low-work function material layer formed of Li, Ca, LiF/Ca, LiF/Al, Al, Mg, Ag, Pt, Pd, Ni, Au Nd, Ir, Cr, BaF, Ba, or a compound or mixture thereof (e.g., the mixture of Ag and Mg). The cathode electrode 180 may further include a transparent metal oxide layer, which is on the low-work function material layer.

The antireflection member AR and the second substrate 190 are on the cathode electrode 180. The antireflection member AR is on the cathode electrode 180, and the second substrate 190 is on the antireflection member AR.

The antireflection member AR may be located on the bottom surface of the second substrate 190. The antireflection member AR may be on a surface of the second substrate 190 that faces the first substrate 100. The antireflection member AR may have a thickness of 100 nm to 500 nm or 200 nm to 300 nm. The antireflection member AR may be formed by a high-density film forming method. In one embodiment, the antireflection member AR may be formed on the bottom surface of the second substrate 190 by sputtering, chemical vapor deposition (CVD), and/or atomic layer deposition (ALD).

The antireflection member AR can improve the transmission of light emitted by the organic light-emitting element and can prevent or substantially prevent external light reflected by the optical element OPS from being reflected by the bottom surface of the second substrate 190, e.g., a flare phenomenon.

The antireflection member AR may be in an area that overlaps with at least one selected from the optical hole HLE_OP and the first, second, and third through holes HLE_TH1, HLE_TH2, and HLE_TH3.

Figure 8:
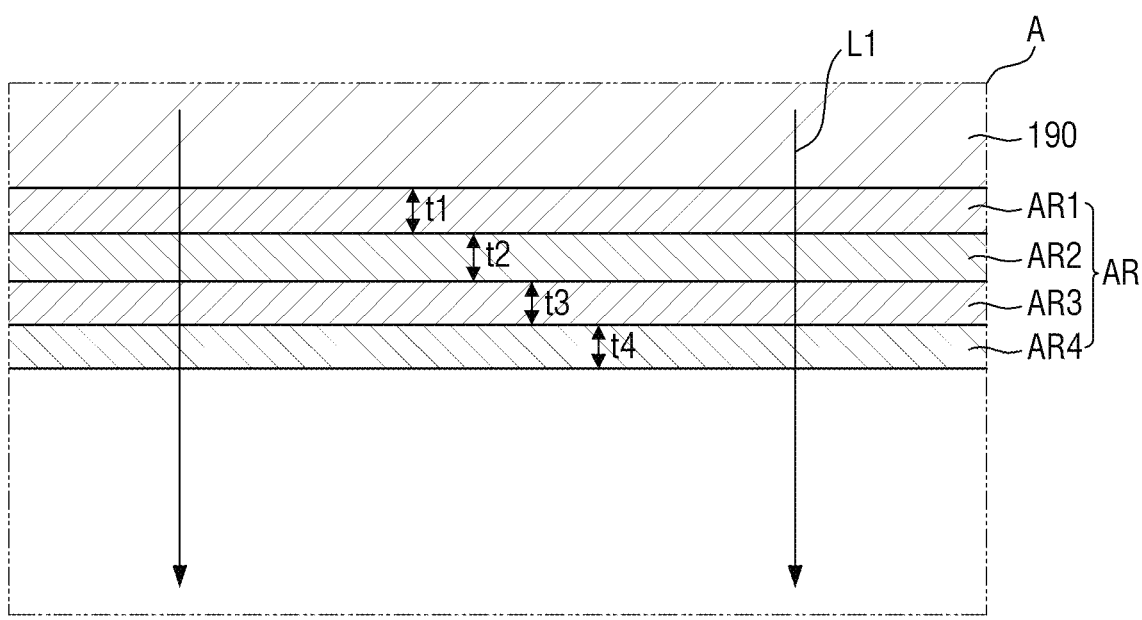
FIG. 8 is an enlarged cross-sectional view of an area A of FIG. 7.

FIG. 8 is an enlarged cross-sectional view of an area A of FIG. 7.

Referring to FIG. 8, the antireflection member AR may have a structure in which a refractive layer having a high refractive index and a refractive layer having a low refractive index are alternately stacked. The antireflection member AR may include first, second, third, and fourth refractive layers AR1, AR2, AR3, and AR4, which are sequentially deposited on the first surface of the second substrate 190 that faces the first substrate 100. The refractive indexes of the first and third refractive layers AR1 and AR3 may be greater than the refractive indexes of the second and fourth refractive layers AR2 and AR4.

The refractive indexes of the first and third refractive layers AR1 and AR3 may be in the range of 1.8 to 2.4, and the refractive indexes of the second and fourth refractive layers AR2 and AR4 may be in the range of 1.47 to 1.6.

When the refractive indexes of the first and third refractive layers AR1 and AR3 are 1.8 or greater, desirable (e.g., minimum) differences between the refractive indexes of the first and third refractive layers AR1 and AR3 and the refractive indexes of the second and fourth refractive layers AR2 and AR4 can be secured. Thus, the light transmittance of the antireflection member AR can be improved, and a flare phenomenon can be prevented, substantially prevented, or reduced. When the refractive indexes of the first and third refractive layers AR1 and AR3 are 2.4 or smaller, the degree of freedom can be secured in terms of material choices. For example, materials for the first and third refractive layers AR1 and AR3 can be selected to meet the above range for the refractive indexes.

Also, when the refractive indexes of the second and fourth refractive layers AR2 and AR4 are 1.6 or smaller, suitable or desirable (e.g., minimum) differences between the refractive indexes of the first and third refractive layers AR1 and AR3 and the refractive indexes of the second and fourth refractive layers AR2 and AR4 can be secured. Thus, the light transmittance of the antireflection member AR can be improved, and a flare phenomenon can be prevented or substantially prevented. When the refractive indexes of the second and fourth refractive layers AR2 and AR4 are 1.47 or greater, the degree of freedom can be secured in terms of material choices. For example, materials for the second and fourth refractive layers AR2 and AR4 can be selected to meet the above range for the refractive indexes.

The first refractive layer AR1 may have a thickness of 5 nm to 15 nm, the second refractive layer AR2 may have a thickness of 25 nm to 40 nm, the third refractive layer AR3 may have a thickness of 100 nm to 130 nm, and the fourth refractive layer AR4 may have a thickness of 80 nm to 100 nm.

The thicknesses of the first, second, third, and fourth refractive layers AR1, AR2, AR3, and AR4 may be set (e.g., selected) in consideration of the refractive indexes of the first, second, third, and fourth refractive layers AR1, AR2, AR3, and AR4 and the condition that beams of light reflected from the first, second, third, and fourth refractive layers AR1, AR2, AR3, and AR4 offset one another. If the refractive indexes and the thicknesses of the first, second, third, and fourth refractive layers AR1, AR2, AR3, and AR4 are set (e.g., selected) as described above, beams of light reflected from the first, second, third, and fourth refractive layers AR1, AR2, AR3, and AR4 may offset one another.

The first, second, third, and fourth refractive layers AR1, AR2, AR3, and AR4 may be formed of materials that can satisfy the aforementioned ranges of refractive indexes.

The first and third refractive layers AR1 and AR3 may include a first inorganic material. The first inorganic material may include at least one selected from, for example, silicon nitride ($SiN_x$), aluminum oxide ($AlO_x$), titanium oxide ($TiO_x$), and niobium oxide ($Nb_2O_5$), but the present disclosure is not limited thereto. The second and fourth refractive layers AR2 and AR4 may include a second inorganic material. The second inorganic material may include at least one selected from, for example, silicon oxide ($SiO_2$) and silicon oxynitride ($SiN_xO_y$), but the present disclosure is not limited thereto. The fourth refractive layer AR4, unlike the second refractive layer AR2, may further include Al, indium (In), and/or gallium (Ga).

In some embodiments, two or more first refractive layers AR1 and two or more second refractive layers AR2 may be provided. In one embodiment, a first refractive layer AR1 may be further located between the second and third refractive layers AR2 and AR3, and a second refractive layer AR2 may be further located between the third and fourth refractive layers AR3 and AR4. In some embodiments, the antireflection member AR may further include a fifth refractive layer AR5 between the first refractive layer AR1 and the first surface of the second substrate 190, and a sixth refractive layer AR6 between the first and fifth refractive layers AR1 and AR5, and a refractive index of the fifth refractive layer AR5 is greater than a refractive index of the sixth refractive layer AR6.

The optical functions of the antireflection member AR will hereinafter be described in more detail.

Figure 9A:
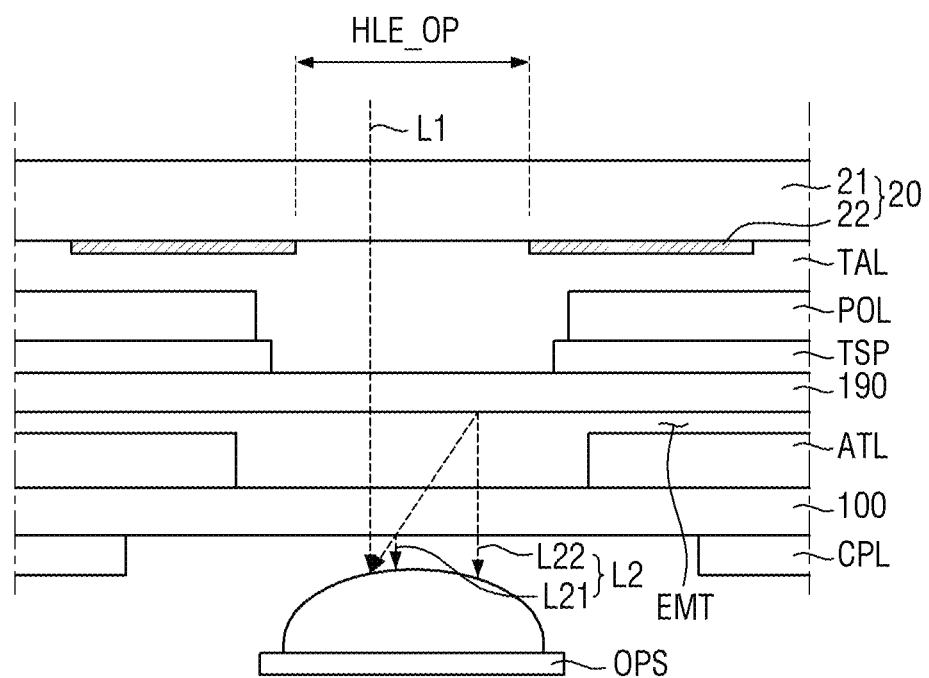
FIGS. 9A and 9B are cross-sectional views illustrating how light travels depending on the presence of an antireflection member.
Figure 9B:
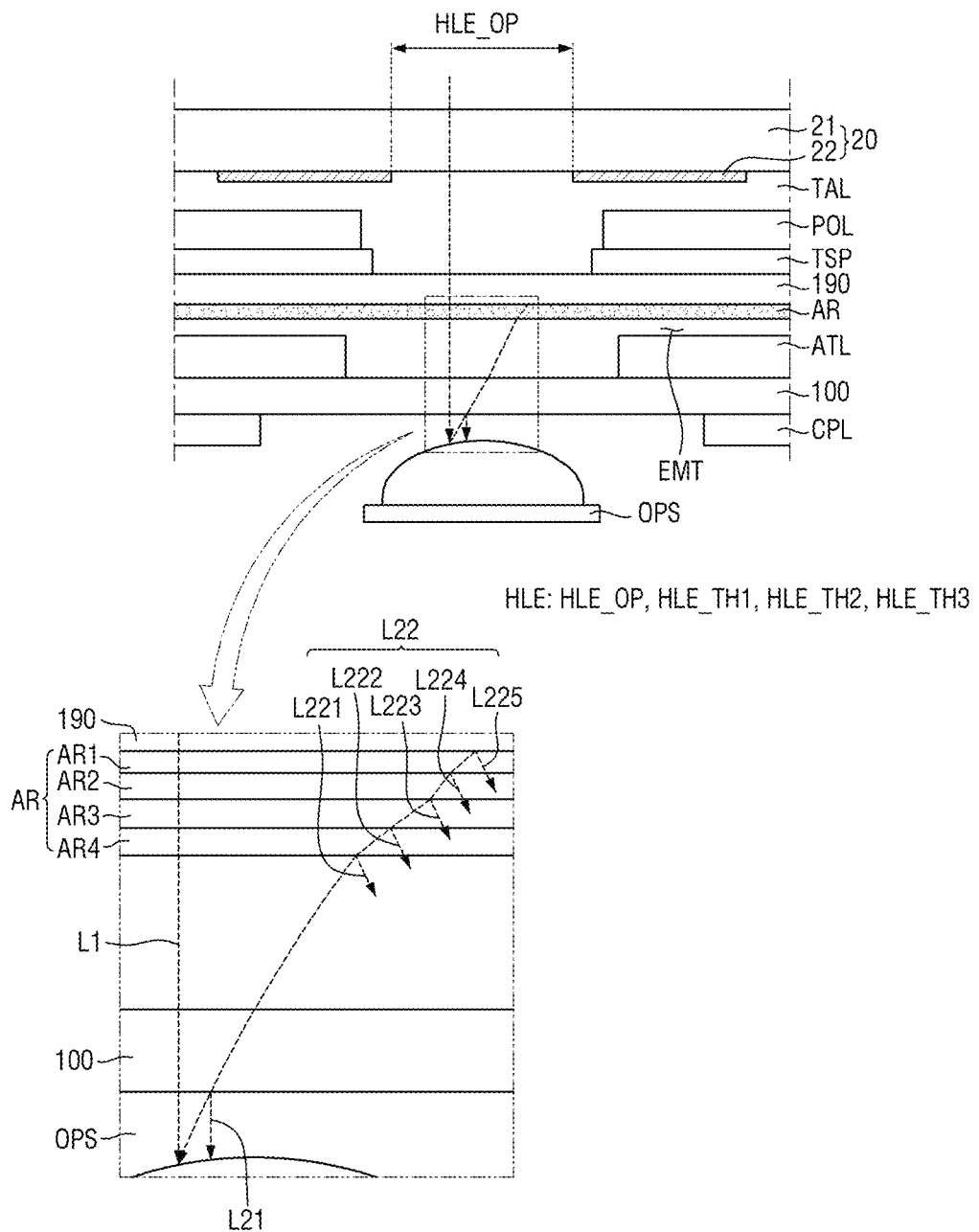

FIGS. 9A and 9B are cross-sectional views illustrating how light travels depending on the presence of an antireflection member.

FIGS. 9A and 9B are cross-sectional views illustrating the surroundings of a hole area of a display device. For example, FIG. 9A illustrates a display device 1 not including the antireflection member AR, and FIG. 9B illustrates a display device 1 including the antireflection member AR.

Referring to FIG. 9A, light L1 incident from outside the display device 1 may arrive at the optical element OPS through the optical hole HLE_OP. The light L1 may be light provided from a subject.

Some of the light L1 may arrive at the optical element OPS and may be reflected by the optical element OPS as light L2. Some of the reflected light may travel in an upward direction and may be reflected by the bottom surface of the first substrate 100 as light L21 and/or by the bottom surface of the second substrate 190 as light L22.

As the optical element OPS does not form an image of the subject simply based on the light L1 from the subject but is affected by the light L21 reflected from the bottom surface of the first substrate 100 and the light L22 reflected from the bottom surface of the second substrate 190, the distortion of the image of the subject and/or a flare phenomenon such as glare may occur.

Referring to FIG. 9B, in a case where the antireflection member AR is on the bottom surface of the second substrate 190, some of light reflected from the optical element OPS may travel in an upward direction and may be reflected by the bottom surface of the first substrate 100 as light L21 and/or by the layers of the antireflection member AR as light L22. For example, the light L22 reflected from the layers of the antireflection member AR may include light L221 reflected from the interface between the fourth refractive layer AR4 and the gap EMT, light L222 reflected from the interface between the third and fourth refractive layers AR3 and AR4, light L223 reflected from the interface between the second and third refractive layers AR2 and AR3, light L224 reflected from the interface between the first and second refractive layers AR1 and AR2, and light L225 reflected from the interface between the first refractive layer AR1 and the second substrate 190.

In one embodiment, as the refractive indexes and the thicknesses of the first, second, third, and fourth refractive layers AR1, AR2, AR3, and AR4 are designed to meet the conditions where beams of light reflected from (e.g., the interface between adjacent layers of) the first, second, third, and fourth refractive layers AR1, AR2, AR3, and AR4 offset one another, the amount of light L22 reflected from the layers of the antireflection member AR can be reduced or minimized, and the occurrence of a flare phenomenon can be suppressed or reduced.

The emission layer 170 may be susceptible to moisture and/or outdoor air (e.g., oxygen). If the emission layer 170 is exposed to moisture and/or oxygen, the emission layer 170 may deteriorate. As described above with reference to FIGS. 2 and 6, the active element layer ATL is sealed by the first substrate 100, the antireflection layer AR, and the sealing member SL. Thus, once the first and second substrates 100 and 190 are bonded together by the sealing member SL, moisture and/or oxygen from outside the display device 1 can be prevented or substantially prevented from infiltrating into the active element layer ATL. However, after the bonding of the first and second substrates 100 and 190, moisture and/or oxygen present on the surface of the antireflection member AR may be released into the active element layer ATL to cause the deterioration of the emission layer 170.

FIGS. 10 through 14 are cross-sectional views illustrating the process to form an antireflection member and to bond a first substrate and a second substrate coated with the antireflection member.

Figure 10:
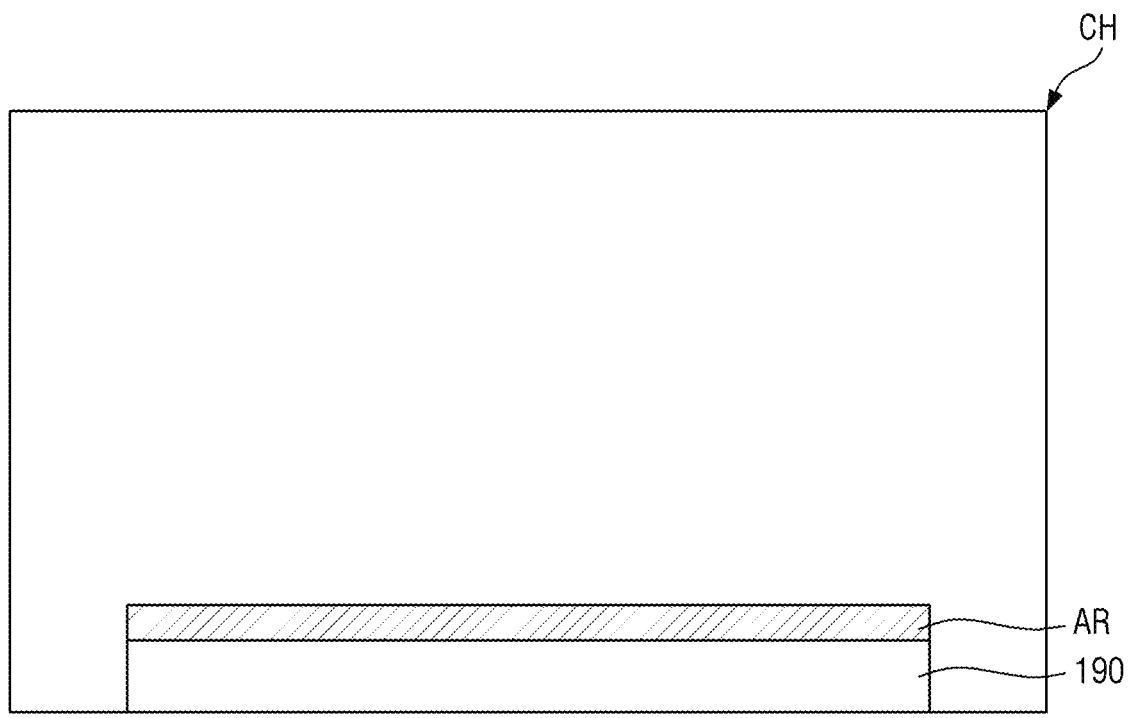
FIGS. 10 through 14 are cross-sectional views illustrating a process to form an antireflection member and to bond a first substrate and a second substrate coated with the antireflection member.
Figure 11:
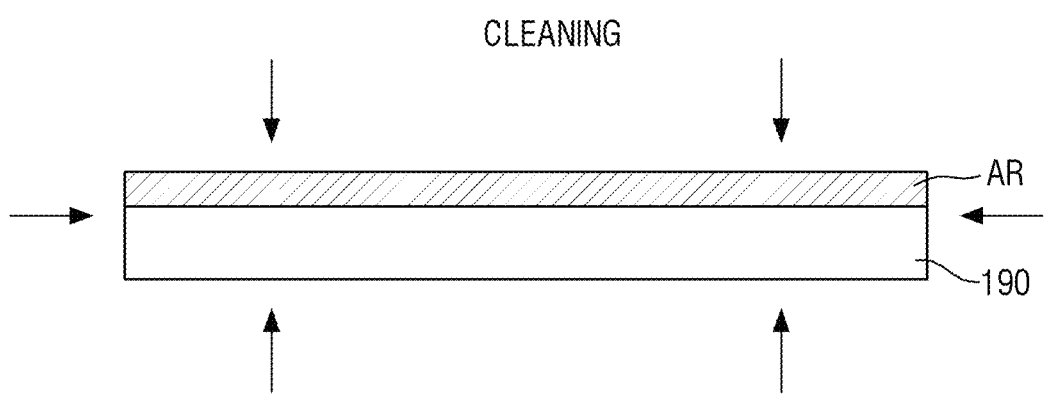
Figure 12:
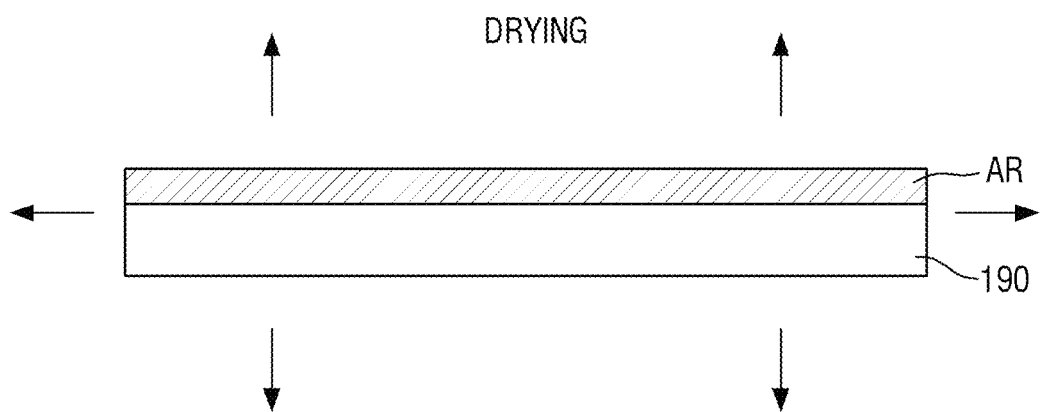
Figure 13:
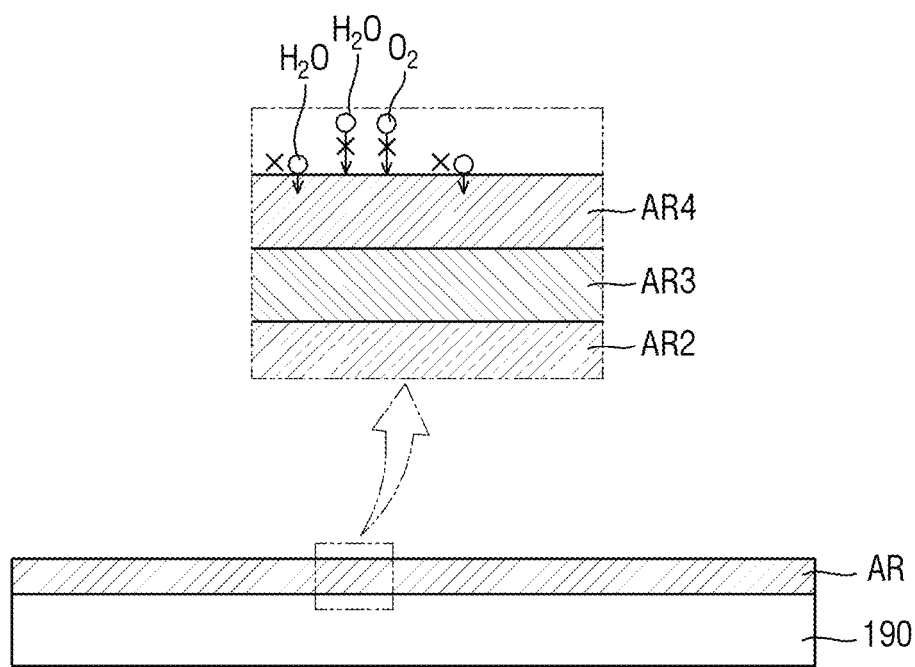
Figure 14:
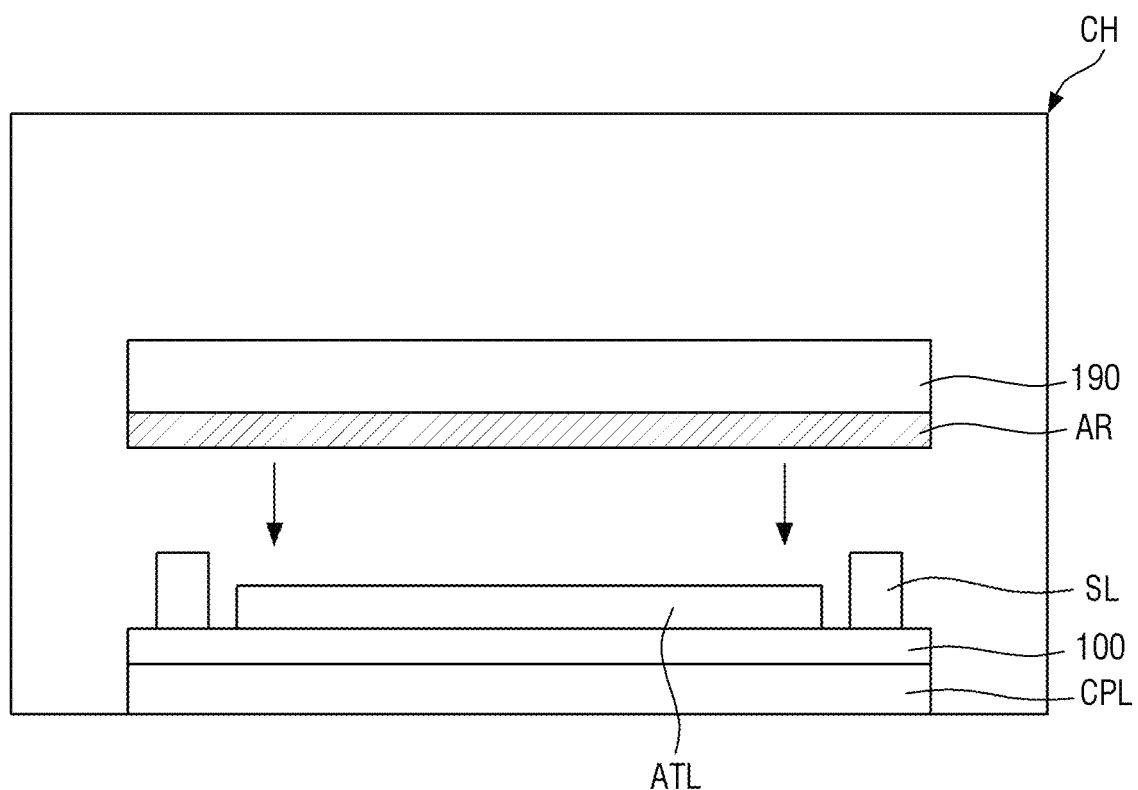

Referring to FIGS. 10-12, the antireflection member AR is coated on the first surface of the second substrate 190, within a chamber CH, and the antireflection member AR and the second substrate 190 are rinsed with a cleaning solution and then dried. The cleaning solution may be water, but the present disclosure is not limited thereto. After the drying of the antireflection member AR and the second substrate 190, most of the cleaning solution may be removed, but some of the cleaning solution may remain. Thereafter, the antireflection member AR and the second substrate 190 are stored. While the antireflection member AR and the second substrate 190 are in storage, outdoor air and/or moisture around the antireflection member AR may be adhered onto the surface of the antireflection member AR (see FIG. 13). Thereafter, referring to FIG. 14, the bonding of the first and second substrates 100 and 190 is performed in the chamber CH. After the bonding of the first and second substrates 100 and 190, outdoor air and/or moisture adhered on the surface of the antireflection member AR may be released and may deteriorate the emission layer 170.

As the filling density of a fourth refractive layer AR4 of the antireflection member AR is enhanced, the adhesion of outdoor air and/or moisture on the surface of the antireflection member AR can be suppressed or reduced while the antireflection member AR and the second substrate 190 are in storage. As the filling density of the fourth refractive layer AR4 increases, the roughness of the surface of the fourth refractive layer AR4 decreases. Accordingly, the degree to which outdoor air (e.g., $O_2$) and/or moisture ($H_2O$) is adsorbed to the surface of the fourth refractive layer AR4 significantly decreases, and as a result, the deterioration of an emission layer 170 after the bonding of the first and second substrates 100 and 190 can be addressed.

The filling density of the fourth refractive layer AR4 can be improved by suitably or properly designing the material of the fourth refractive layer AR4.

The fourth refractive layer AR4 may further include Al, In, and/or Ga. Accordingly, the filling density of the fourth refractive layer AR4 can be improved, and the surface roughness of the fourth refractive layer AR4 can be reduced. The atomic percent of Al, In, or Ga with respect to the entire composition of the entire fourth refractive layer AR4 may be 0.5% to 5%. If the atomic percent of Al, In, or Ga with respect to the entire composition of the fourth refractive layer AR4 is 0.5% or greater, the filling density of the fourth refractive layer AR4 can be effectively improved, and the surface roughness of the fourth refractive layer AR4 can be reduced. If the atomic percent of Al, In, or Ga with respect to the composition of the entire fourth refractive layer AR4 is 5% or less, the optical properties of the antireflection member AR can be maintained without exceeding the range of refractive indexes of the fourth refractive layer AR4.

The surface roughness (or RMS, nm) of the fourth refractive layer AR4 may be measured from 20 locations in a 5000 nm×5000 nm region on the surface (continuous section) of the fourth refractive layer AR4 at an interval of 250 nm with a transmission electron microscope (TEM) at an observation magnification of 30,000 or greater. Then, the standard deviation of the surface roughness measurements may be determined as the surface roughness of the fourth refractive layer AR4. The surface roughness of the fourth refractive layer AR4 may be 1.3 nm or smaller.

The entire surface of the fourth refractive layer AR4 may be (e.g., may appear) substantially the same. This not only refers to that the entire surface of the fourth refractive layer AR4 has the same roughness or is in the same roughness range, but may also encompass that the surface roughness of the fourth refractive layer AR4 has a deviation of only about 10%, over the entire fourth refractive layer AR4 and thus appears, to the naked eye, as being the same throughout the entire fourth refractive layer AR4.

It will hereinafter be described how an embodiment having an antireflection member applied thereto can have a higher light transmittance than a comparative example having no antireflection member applied thereto.

Figure 15:
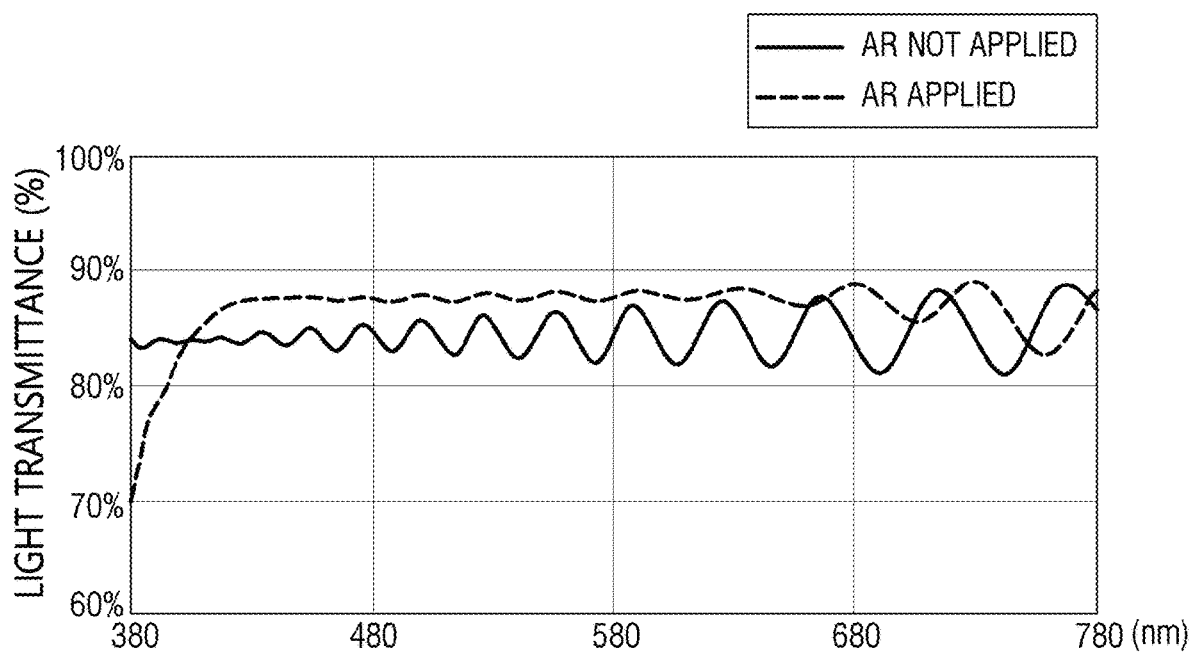
FIG. 15 is a graph showing the light transmittance of an example in which an antireflection member is applied to a second substrate and the light-transmittance of a comparative example in which no antireflection member is applied to a second substrate.

FIG. 15 is a graph showing the light transmittance of an example having an antireflection member applied thereto and the light-transmittance of a comparative example having no antireflection member applied thereto.

Referring to FIG. 15, the example may include a second substrate 190 having an antireflection member AR directly on the bottom surface of the second substrate 190, as illustrated in FIG. 2, and the antireflection member AR may have the structure illustrated in FIG. 8. The comparative example may include a second substrate 190 having no antireflection member AR applied thereto. Referring to FIG. 15, the horizontal axis represents the wavelength (nm) of light applied to the antireflection member AR and the second substrate 190 (in the case of the example) or to the second substrate 190 (in the case of the comparative example), and the vertical axis represents the ratio of the intensity of light applied from the organic light-emitting elements to the intensity of light transmitted through both the antireflection member AR and the second substrate 190 (in the case of the example) or through only the second substrate 190 (in the case of the comparative example).

As shown in FIG. 15, the example has a higher light transmittance (%) than the comparative example in a range of wavelengths of about 400 nm to about 700 nm. For example, as the antireflection member AR is directly below the second substrate 190, light transmittance can be improved, and reflected light can be reduced or minimized so that a flare phenomenon can be effectively suppressed or reduced.

The enhancement effects of embodiments where an antireflection member is provided directly below a second substrate and the filling density of a fourth refractive layer of the antireflection member is increased by doping the fourth refractive layer with Al, In, and/or Ga will hereinafter be described in more detail.

For convenience, an embodiment where an antireflection member is provided directly below a second substrate and a fourth refractive layer of the antireflection member is formed of silicon aluminum oxide (Si$_x$Al$_y$O$_z$) (where the atomic percent of Al is 0.5% to 5% and the atomic ratio of oxygen to silicon is 1.7) will hereinafter be referred to as sample #1, and embodiments where an antireflection member is provided directly below a second substrate and a fourth refractive layer of the antireflection member is formed of silicon oxide (SiO$_2$) will hereinafter be referred to as samples #2 and #3.

Figure 16:
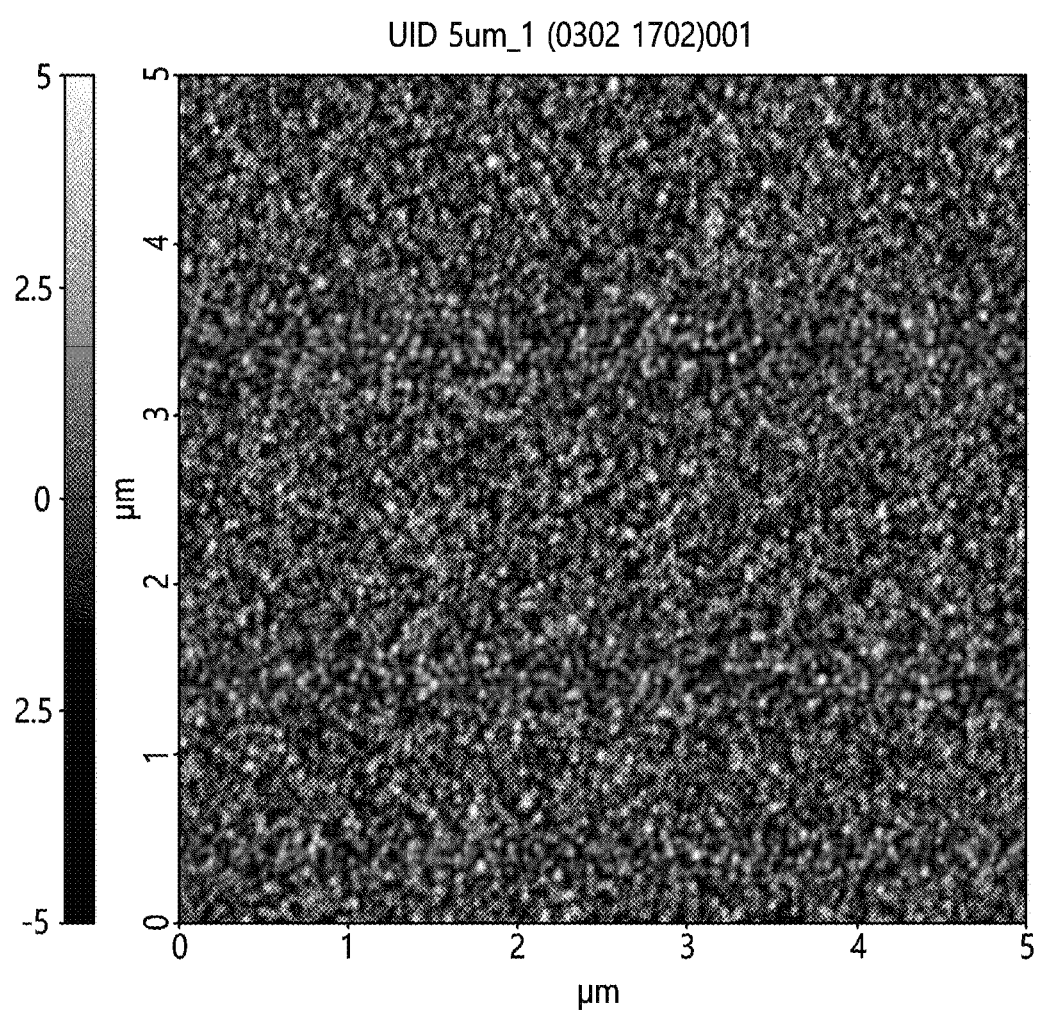
FIG. 16 is a photograph showing the roughness or RMS of sample #1.
Figure 17:
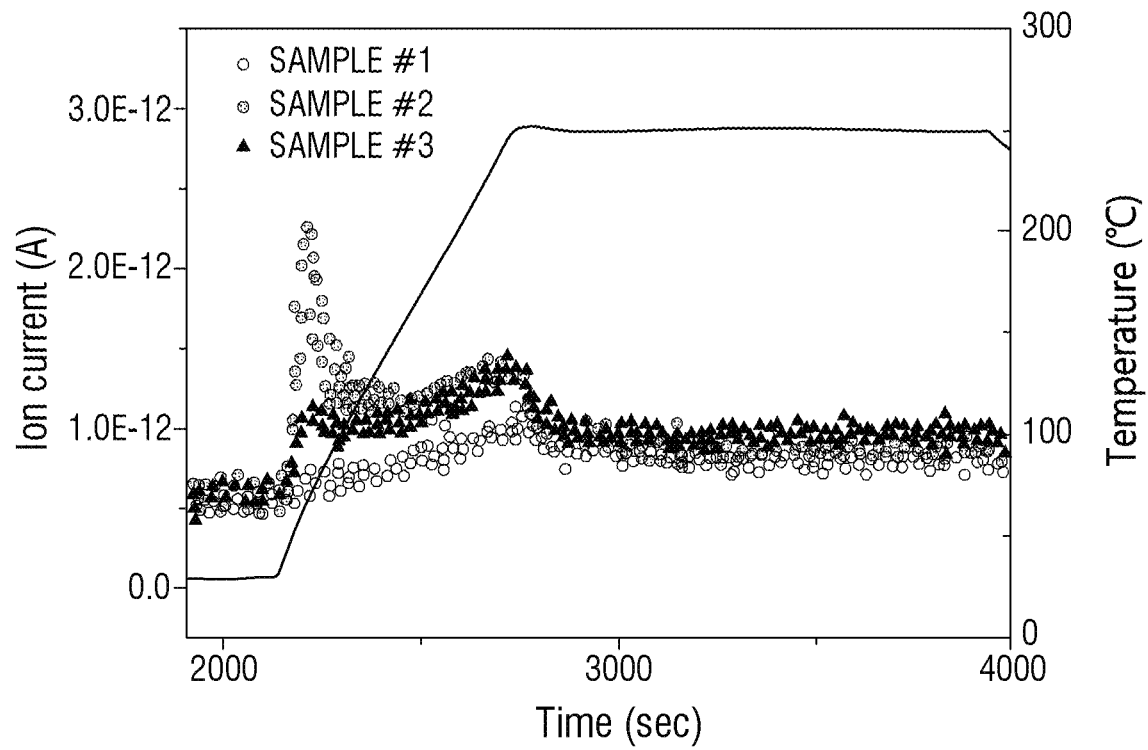
FIGS. 17 and 18 are graphs showing the oxygen emissions of samples #1, #2, and #3.
Figure 18:
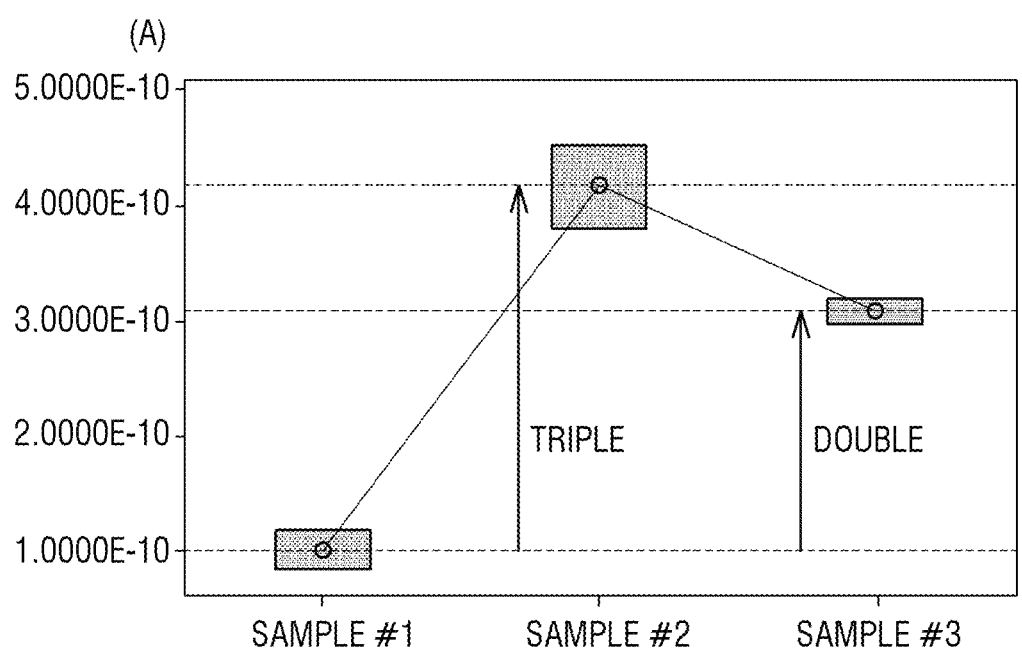
Figure 19:
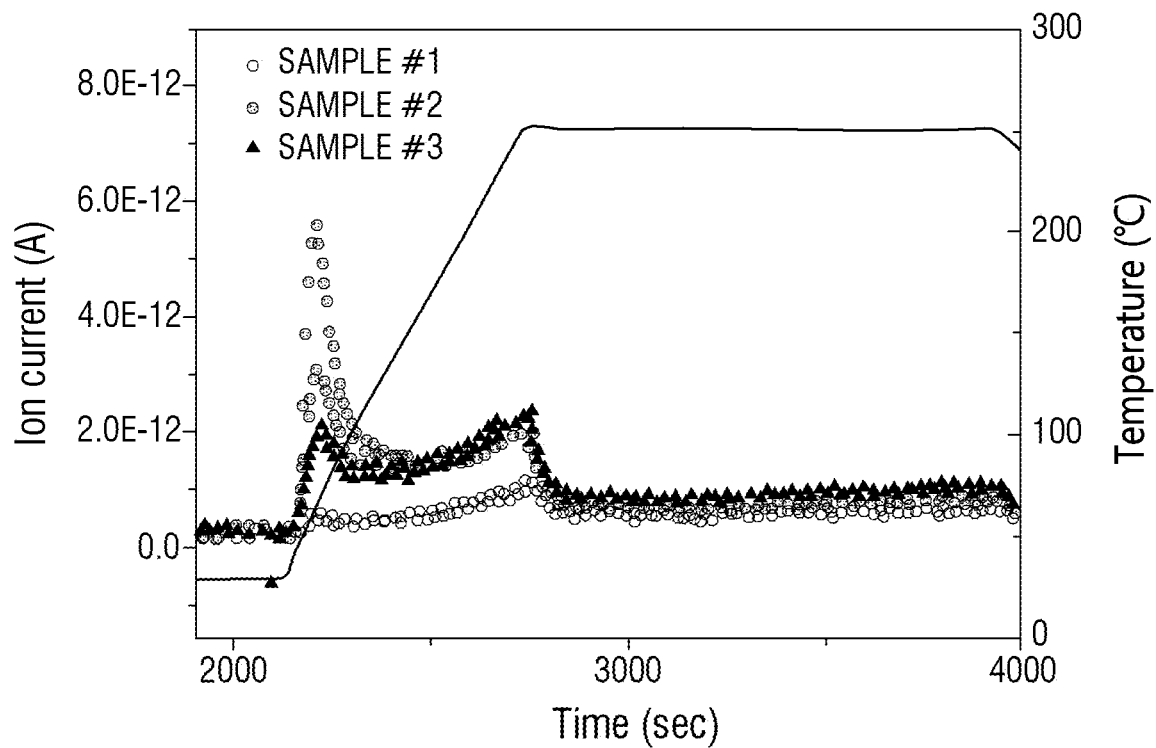
FIGS. 19 and 20 are graphs showing the moisture emissions of samples #1, #2, and #3.
Figure 20:
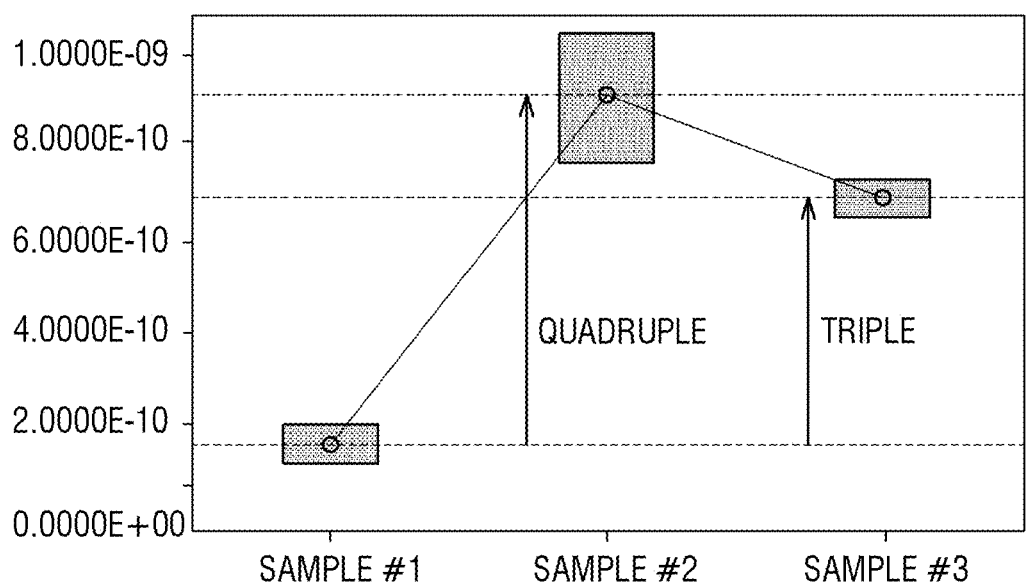

Table 1 below shows the specifications of samples #1, #2, and #3. FIG. 16 shows the roughness of sample #1. FIGS. 17 and 18 are graphs showing the oxygen emissions of samples #1, #2, and #3. FIGS. 19 and 20 are graphs showing the moisture emissions of samples #1, #2, and #3.

TABLE 1

| Samples | | Sample #1 | Sample #2 | Sample #3 |
|---|---|---|---|---|
| Shrinkage Defect | | X | O | O |
| Film Forming Method | | Sputtering | Sputtering | Sputtering |
| Stack Structure (Ingredients) | | Four-Layer (NbO$_x$/SiO$_x$/ NbO$_x$/SiO$_x$) | Four-Layer (NbO$_x$/SiO$_x$/ NbO$_x$/SiO$_x$) | Four-Layer (NbO$_x$/SiO$_x$/ NbO$_x$/SiO$_x$) |
| Total Thickness (nm) | | 260 | 240 | 300 |
| High-Reliability AR Coating Film | Al Doping | O | X | X |
| | Outgas (molec/cm$^2$) | 3E+15 | 5.5E+15 | — |
| | Composition (O/Si) | 1.7 | 1.6 | 1.6 |
| | RMS (nm) | 1.1 | 1.4 | 1.5 |

Production Example 1

Fabrication of Sample #1

First, second, third, and fourth refractive layers were sequentially deposited on a glass substrate by sputtering.

The first and third refractive layers were formed of niobium oxide (Nb$_2$O$_5$), the second refractive layer was formed of silicon oxide (SiO$_2$), and the fourth refractive layer was formed of silicon aluminum oxide (Si$_x$Al$_y$O$_z$). The atomic percent of Al in the fourth refractive layer is 0.5% to 5%. The oxygen-to-silicon atomic ratio of sample #1 is 1.7.

The thickness of sample #1 is 260 nm.

Fabrication of Samples #2 and #3

Samples #2 and #3 each differ from sample #1 in that the fourth refractive layer was formed of silicon oxide (SiO$_2$).

The thickness of sample #2 is 230 nm, and the thickness of sample #3 is 300 nm.

The oxygen-to-silicon atomic ratio of each of samples #2 and #3 is 1.6.

Experimental Example 1: Surface Roughness

Measurement of Surface Roughness

As described above with reference to FIG. 15, the surface roughnesses of samples #1, #2, and #3 were measured. Specifically, the surface roughness of each of samples #1, #2, and #3 was measured from 20 locations in a 5000 nm×5000 nm region on the surface of the corresponding sample at an interval of 250 nm with a TEM at an observation magnification of 30,000 or greater.

Surface Roughness Measurement Results

The surface roughness of sample #1 is 1.1 nm, the surface roughness of sample #2 is 1.4 nm, and the surface roughness of sample #3 is 1.5 nm.

Production Example 2

Fabrication of Sample #1

The same sample as sample #1 of Production Example 1 except for having a size of 10 cm×10 cm was prepared.

Fabrication of Samples #2 and 3

The same samples as samples #2 and #3 of Production Example 1 except for having a size of 10 cm×10 cm were prepared.

Experimental Example 2: Oxygen Emission

Measurement of Oxygen Emission

Samples #1, #2, and #3 were subjected to heat treatment in a chamber at a temperature of 900° C. and were then exposed to the air for 48 hours.

Thereafter, as shown in FIGS. 17 and 18, the oxygen emissions of samples #1, #2, and #3 were measured while changing the temperature (° C.) over a period from 2000 sec and 4000 sec.

Oxygen Emission Measurement Results

The oxygen emissions of samples #1, #2, and #3 were converted into, and output as, ion currents (A).

As shown in FIG. 17, the ion currents of samples #1, #2, and #3 increase up until about 2800 sec and decrease after 2800 sec.

Sample #1 generally has a lower ion current than samples #2 and #3.

FIG. 18 shows that during the period from 2000 sec to 4000 sec, the amount of ion current of sample #2 is about three times greater than the amount of ion current of sample #1 and the amount of ion current of sample #3 is about two times greater than the amount of ion current of sample #1.

Experimental Example 3: Moisture Emission

Measurement of Moisture Emission

Samples #1, #2, and #3 were subjected to heat treatment in a chamber at a temperature of 900° C. and were then exposed to the air for 48 hours.

Thereafter, as shown in FIGS. 19 and 20, the moisture emissions of samples #1, #2, and #3 were measured while changing the temperature (° C.) over the period from 2000 sec and 4000 sec.

Moisture Emission Measurement Results

The moisture emissions of samples #1, #2, and #3 were converted into, and output as, ion currents (A).

As shown in FIG. 19, the ion currents of samples #1, #2, and #3 increase up until about 2800 sec and then decrease after 2800 sec.

Sample #1 generally has a lower ion current than samples #2 and #3.

FIG. 20 shows that during the period from 2000 sec to 4000 sec, the amount of ion current of sample #2 is about four times greater than the amount of ion current of sample #1 and the amount of ion current of sample #3 is about three times greater than the amount of ion current of sample #1.

A display device according to another embodiment of the present disclosure will hereinafter be described in more detail, focusing mainly on the differences with the display device 1 of FIGS. 1 through 9B. Descriptions of elements or features that have already been described above will be omitted or simplified.

Figure 21:
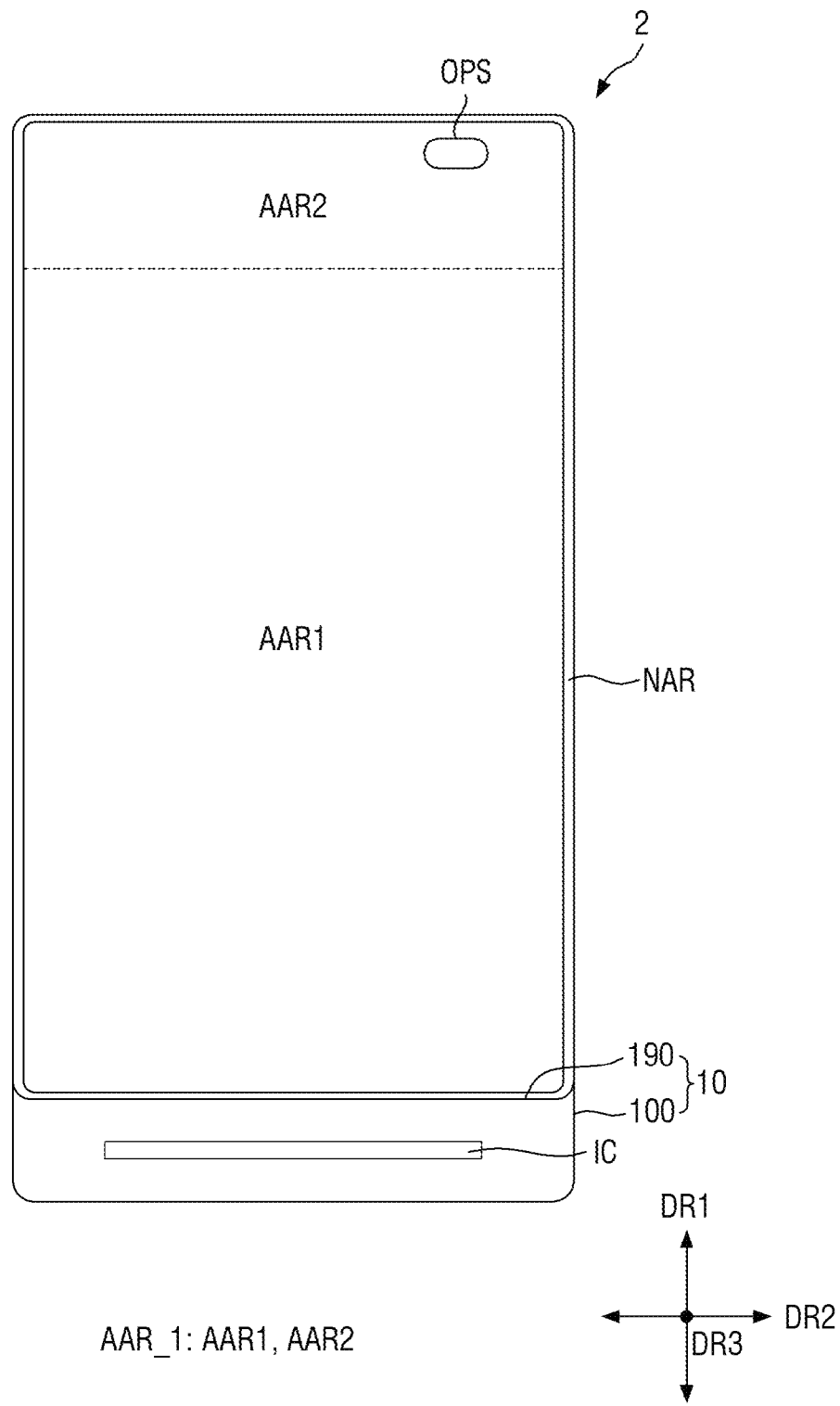
FIG. 21 is a plan view of a display device according to another embodiment of the present disclosure.
Figure 22:
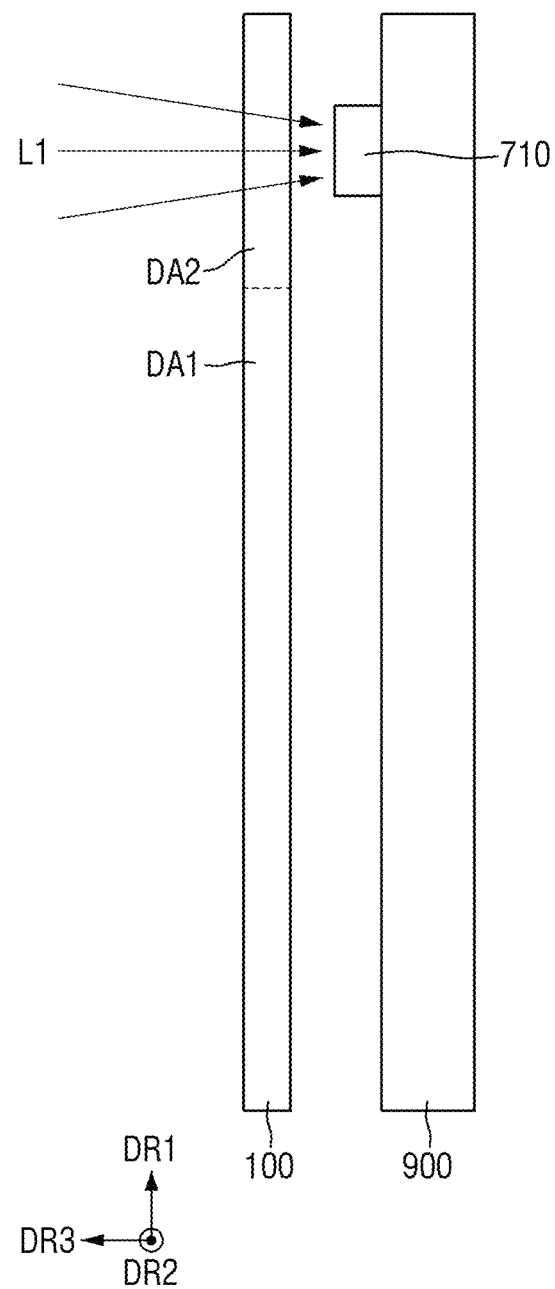
FIG. 22 is a cross-sectional view of the display device of FIG. 21.
Figure 23:
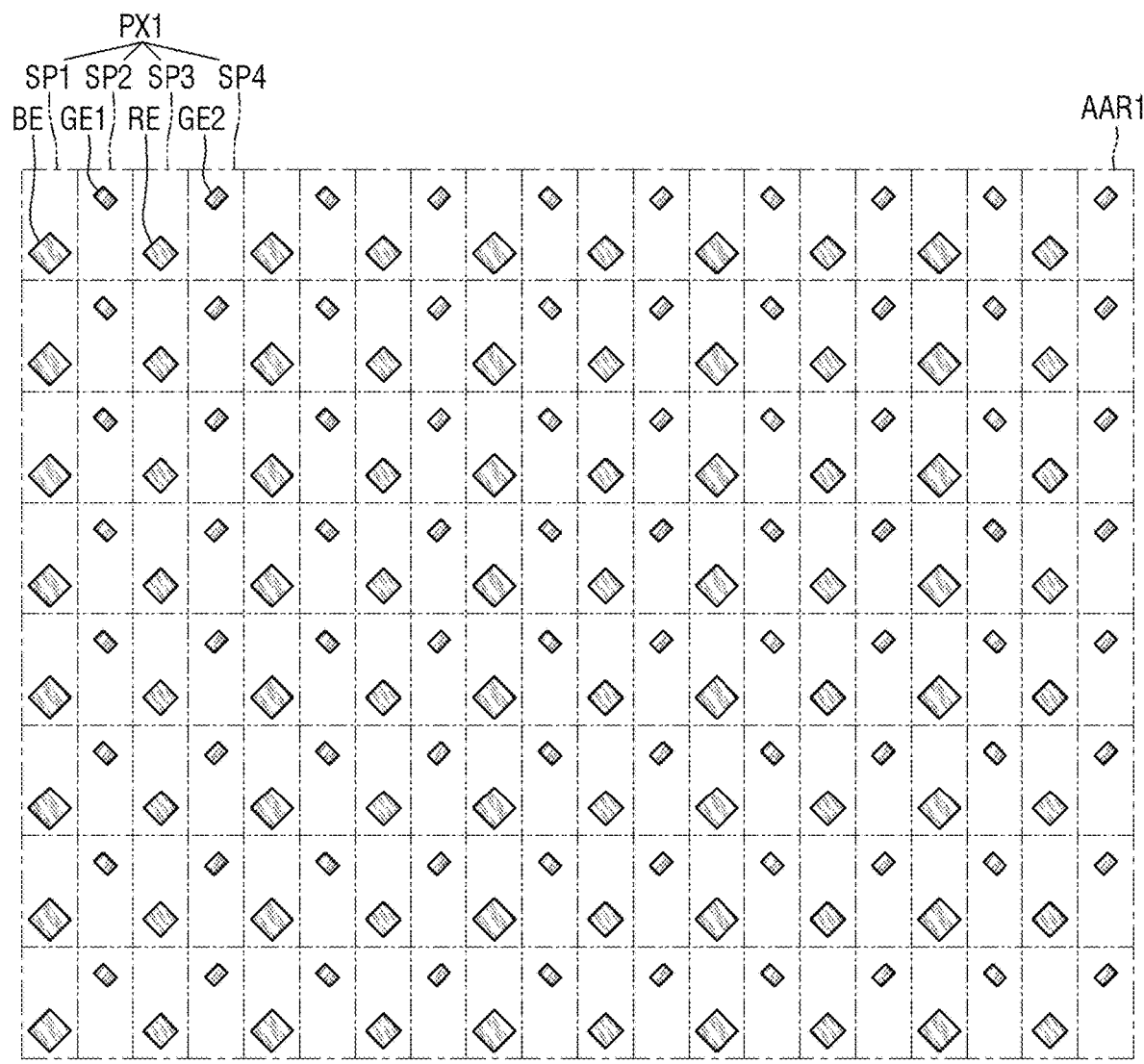
FIG. 23 is a plan view of a first active region of the display device of FIG. 21.
Figure 24:
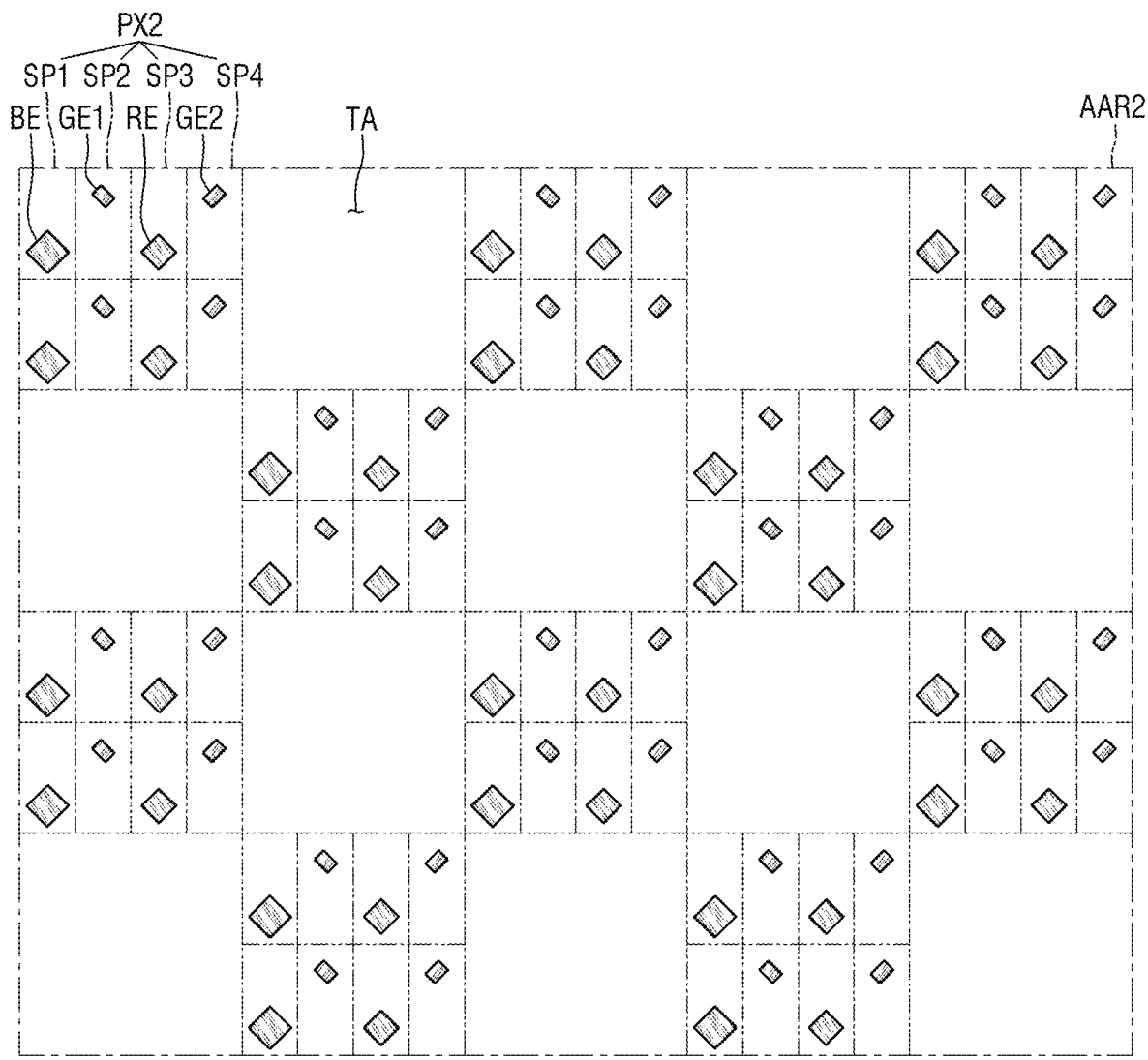
FIG. 24 is a plan view of a second active region of the display device of FIG. 21.

FIG. 21 is a plan view of a display device according to another embodiment of the present disclosure. FIG. 22 is a cross-sectional view of the display device of FIG. 21. FIG. 23 is a plan view of a first active region of the display device of FIG. 21. FIG. 24 is a plan view of a second active region of the display device of FIG. 21.

Referring to FIGS. 21 through 24 and further to FIGS. 1 through 9B, a display device 2 differs from the display device 1 of FIGS. 1 through 4 in that an active region AAR_1 includes a first active region AAR1 and a second active region AAR2, which has a smaller size than the first active region AAR1.

An optical element OPS may be located in, and overlap with, the second active region AAR2.

An antireflection member AR may cover the first and second active regions AAR1 and AAR2.

The first active region AAR1 may include a plurality of first pixels PX1, and the second active region AAR2 may include a plurality of second pixels PX2. The first pixels PX1 may be the same as the pixels PX of FIG. 1.

Referring to FIG. 24, the second active region AAR may include the second pixels PX2, which are for displaying an image, and light-transmitting windows TA.

Each of the second pixels PX2 may include first, second, third, and fourth subpixels SP1, SP2, SP3, and SP4. The first, second, third, and fourth subpixels SP1, SP2, SP3, and SP4 may be substantially the same as the first, second, third, and fourth subpixels SP1, SP2, SP3, and SP4, respectively, of each of the pixels PX of FIG. 1, and thus, detailed descriptions thereof will be omitted.

The light-transmitting windows TA may be regions that can transmit light therethrough. The second pixels PX2 are not in the light-transmitting windows TA. The number of second pixels PX2 per unit area in the second active region AAR2 (e.g., pixels per inch (PPI)) may be smaller than the number of first pixels PX1 per unit area of the first active region AAR1. For example, space for arranging the light-transmitting windows TA can be secured by reducing the number of second pixels PX2 in the second active region AAR2.

The light-transmitting windows TA may be adjacent to one another in first and second directions DR1 and DR2. The light-transmitting windows TA may be arranged in a zigzag fashion. Each of the light-transmitting windows TA may be surrounded by second pixels PX2.

As the number of second pixels PX2 per unit area of the second active region AAR2 is reduced below the number of first pixels PX1 per unit area of the first active region AAR1, as shown in FIG. 24, space for arranging the light-transmitting windows TA in the second active region AAR2 can be secured.

In the embodiment of FIGS. 21 through 24, like in the embodiment of FIGS. 1 through 9B, the optical element OPS may form an image of a subject not only utilizing incident light from the subject, but also reflected light from the bottom surface of a first substrate 100 and from the bottom surface of a second substrate 190, and as a result, a flare phenomenon in which the image of the subject is not clearly visible may occur. However, as the antireflection member AR is on the bottom surface of the second substrate 190, the flare phenomenon can be suppressed or reduced.

Also, as the filling density of a fourth refractive layer AR4 of the antireflection member AR is enhanced, the adhesion of outdoor air and/or moisture on the surface of the antireflection member AR can be suppressed or reduced while the antireflection member AR and the second substrate 190 are in storage. As the filling density of the fourth refractive layer AR4 increases, the roughness of the surface of the fourth refractive layer AR4 decreases. Accordingly, the degree to which outdoor air (e.g., $O_2$) and/or moisture ($H_2O$) is adsorbed to the surface of the fourth refractive layer AR4 significantly decreases, and as a result, the deterioration of an emission layer 170 can be addressed after the bonding of the first and second substrates 100 and 190.

Although embodiments of the present disclosure have been described for illustrative purposes, those skilled in the art will appreciate that various modifications, additions and substitutions are possible, without departing from the scope and spirit of the present disclosure as disclosed in the accompanying claims, and equivalents thereof.

What is claimed is:

1. A display device comprising:
   a display substrate having a hole area, an active region surrounding the hole area, and a nonactive region around the active region;
   an active element layer on a first surface of the display substrate and in the active region;
   an encapsulation substrate facing the first surface of the display substrate, the encapsulation substrate being on the active element layer;
   an antireflection member on a first surface of the encapsulation substrate that faces the display substrate, the antireflection member having a portion spaced apart from the active element layer in a first direction normal to the first surface of the encapsulation substrate, the portion being on the first surface of the encapsulation substrate; and
   an optical element below the display substrate and overlapping the hole area,
   wherein the active element layer includes a through hole overlapping with the hole area.

2. The display device of claim 1, wherein
   the antireflection member comprises first, second, third, and fourth refractive layers sequentially stacked from the first surface of the encapsulation substrate,
   refractive indexes of the first and third refractive layers are greater than refractive indexes of the second and fourth refractive layers, and
   the fourth refractive layer comprises aluminum, indium, or gallium.

3. The display device of claim 2, wherein the antireflection member covers the hole area.

4. The display device of claim 2, wherein the optical element comprises a camera, a lens, an infrared sensor, an iris sensor, and/or an illumination sensor.

5. The display device of claim 2, wherein a surface roughness (RMS) of the fourth refractive layer is 1.3 nm or smaller.

6. The display device of claim 2, wherein
   the refractive indexes of the first and third refractive layers are 1.8 to 2.4, and
   the refractive indexes of the second and fourth refractive layers are 1.47 to 1.6.

7. The display device of claim 2, wherein
   a thickness of the first refractive layer is 5 nm to 15 nm,
   a thickness of the second refractive layer is 25 nm to 40 nm,
   a thickness of the third refractive layer is 100 nm to 130 nm, and
   a thickness of the fourth refractive layer is 80 nm to 100 nm.

* * * * *